United States Patent [19]

Kubota

[11] Patent Number: 5,842,001
[45] Date of Patent: Nov. 24, 1998

[54] CLOCK SIGNAL ADJUSTING METHOD AND APPARATUS

[75] Inventor: Katsuhisa Kubota, Kawasaki, Japan

[73] Assignee: Fujitsu Limited, Kawasaki, Japan

[21] Appl. No.: 393,442

[22] Filed: Feb. 23, 1995

[30] Foreign Application Priority Data

Mar. 11, 1994 [JP] Japan .................................. 6-041225

[51] Int. Cl.$^6$ ...................................................... G06F 1/12
[52] U.S. Cl. ........................................... 395/551; 395/552
[58] Field of Search .................................. 395/550, 551, 395/552

[56] References Cited

U.S. PATENT DOCUMENTS

| | | | |
|---|---|---|---|
| 4,063,308 | 12/1977 | Collins et al. | 395/550 |
| 5,204,559 | 4/1993 | Deyhimy et al. | 307/480 |
| 5,220,660 | 6/1993 | Yoshizawa et al. | 395/550 |
| 5,481,563 | 1/1996 | Hamre | 375/226 |

FOREIGN PATENT DOCUMENTS 4-157379  5/1992  Japan .

*Primary Examiner*—Thomas M. Heckler
*Assistant Examiner*—Dennis M. Butler
*Attorney, Agent, or Firm*—Staas & Halsey

[57] ABSTRACT

A clock signal adjusting method and apparatus are applicable to an information processing system in which clock signals are distributed from a clock generating unit to a plurality of load units, each of the plurality of load units having at least a load element operated in synchronism with a clock signal input to each of the load units. In the clock signal adjusting method and apparatus, delay times set in each of a plurality of delay units are measured in accordance with setting instructions, each of the plurality of delay units delaying an input signal by a delay time set therein, setting instructions corresponding to delay times to be set in the plurality of delay units are input to the plurality of delay units based on measuring results obtained in the previous step, reference phase signals having predetermined phase differences are generated based on outputs of the plurality of delay units, and a phase of the clock signal distributed for the load element in each of the load units is adjusted based on phases of the reference phase signals thus generated.

24 Claims, 22 Drawing Sheets

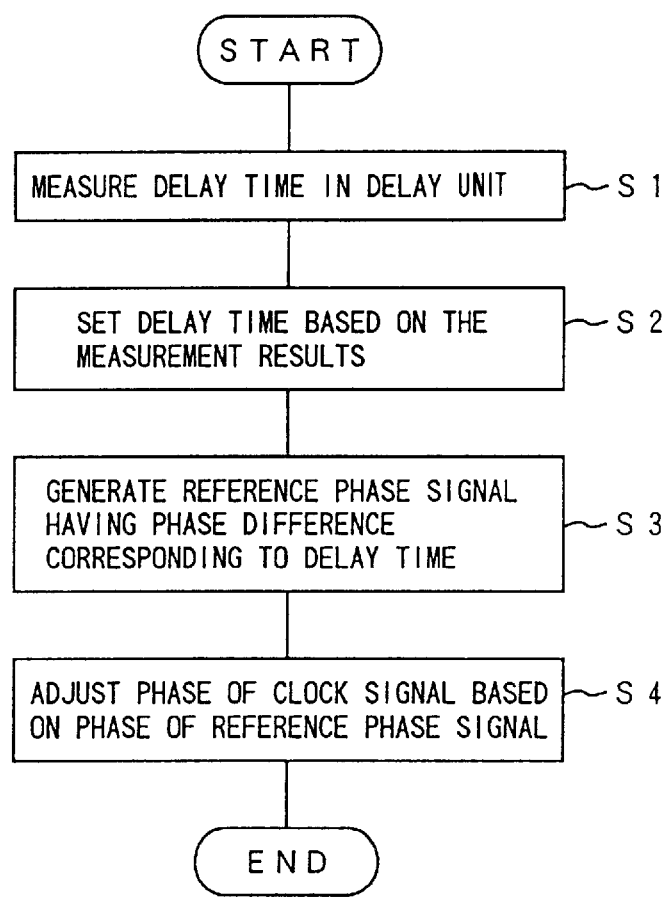

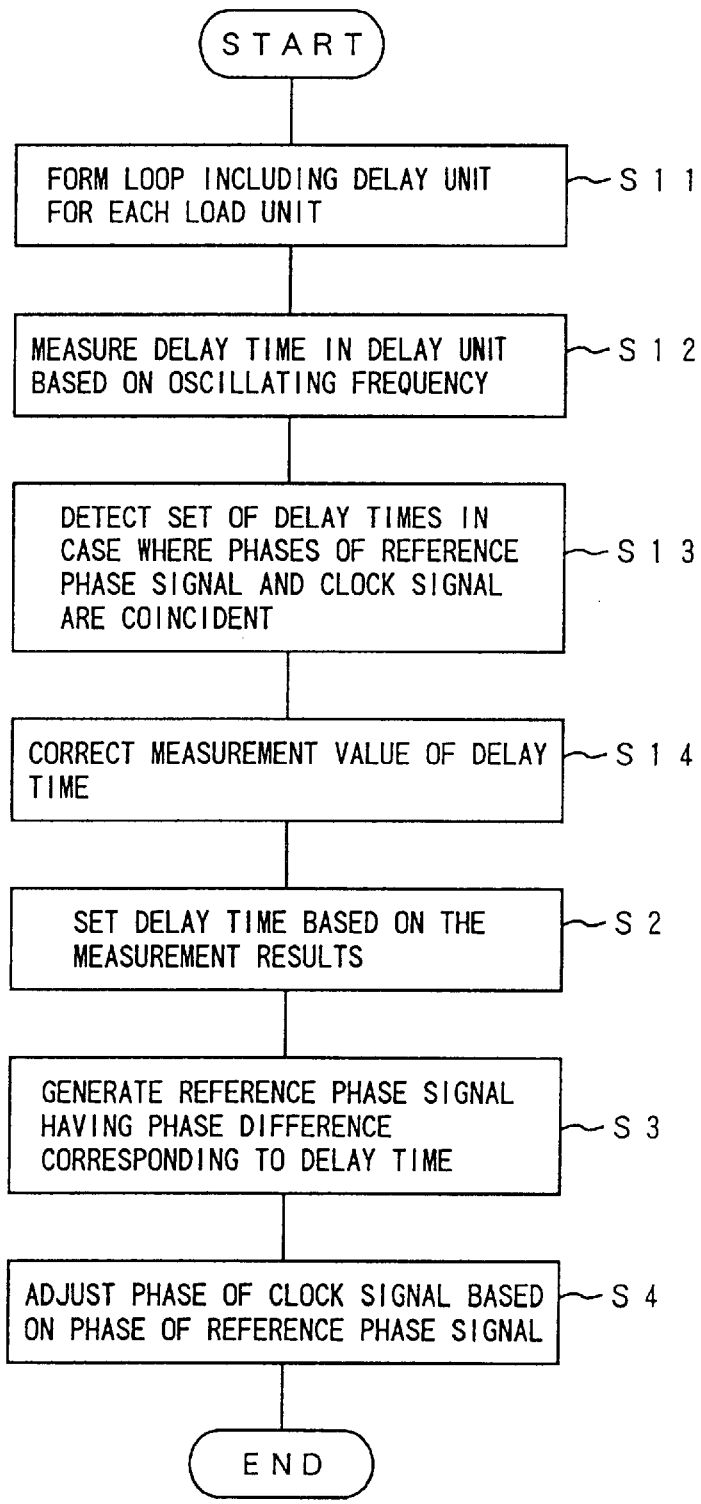

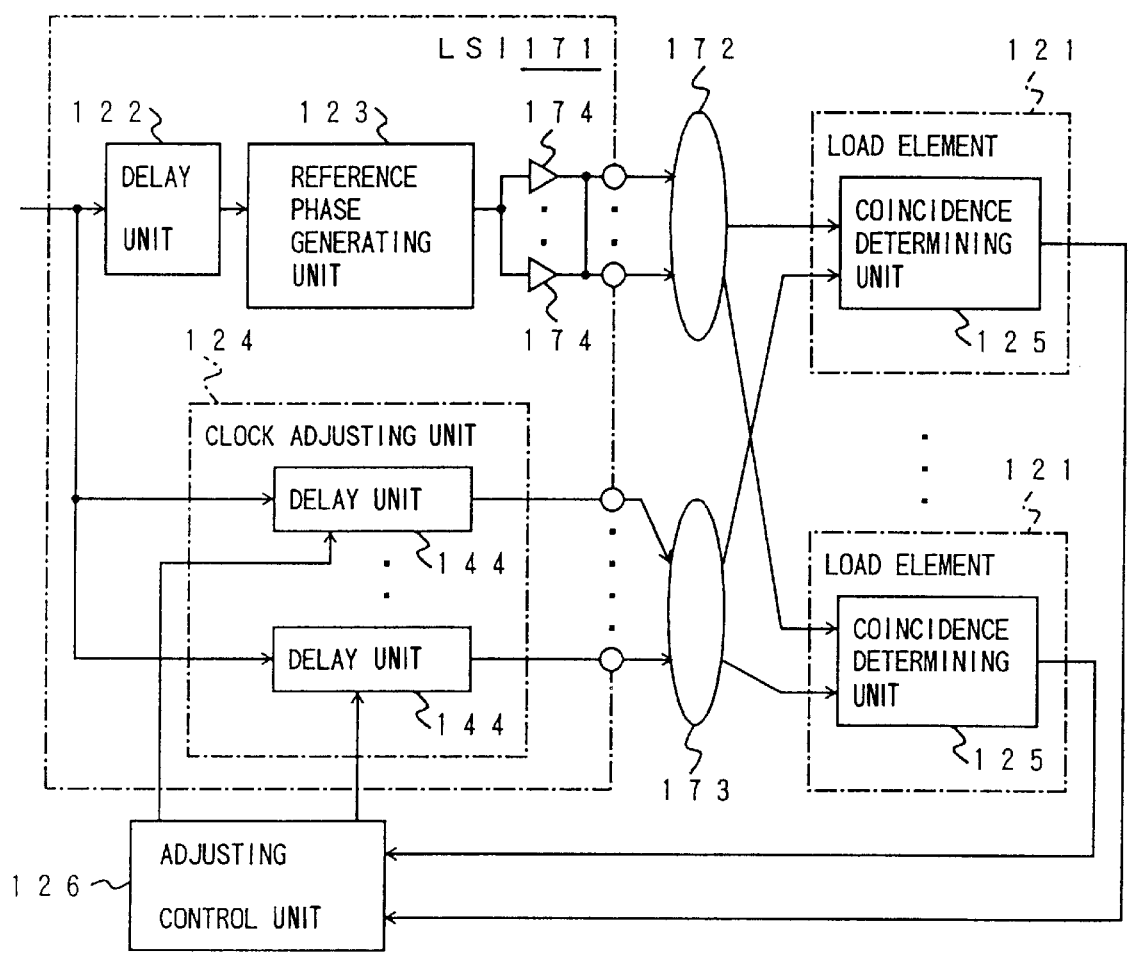
F I G. 11

F I G. 1 4
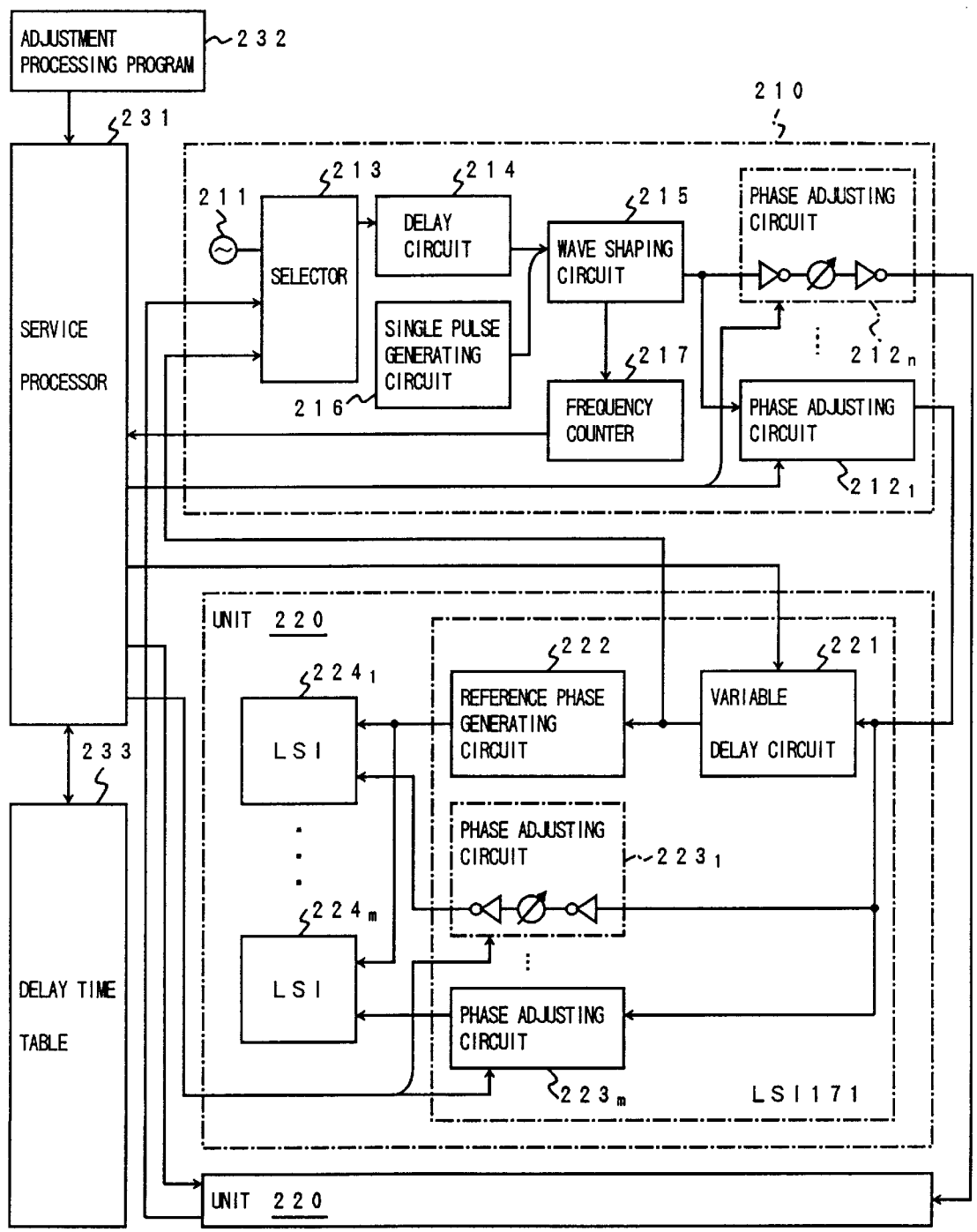

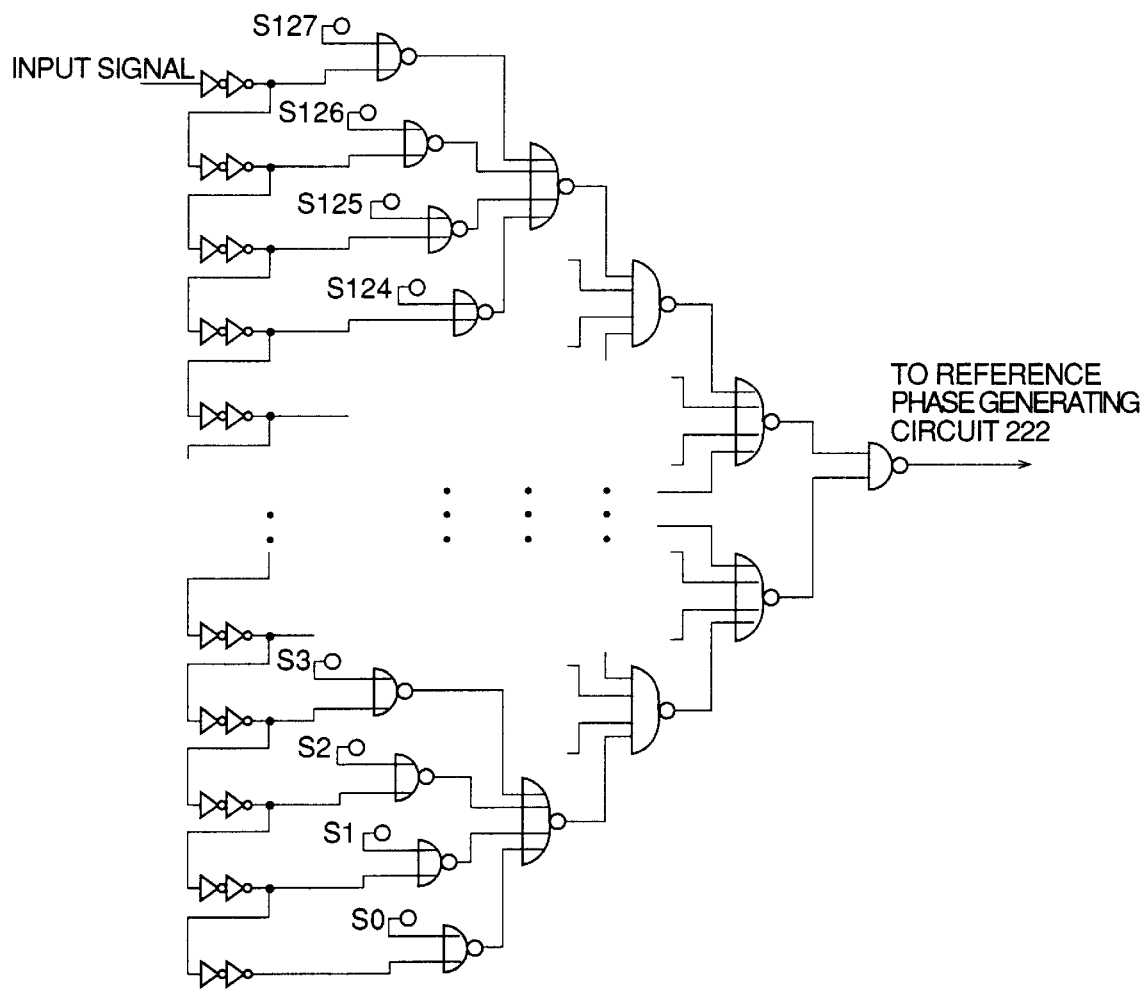
F I G . 15

F I G. 16
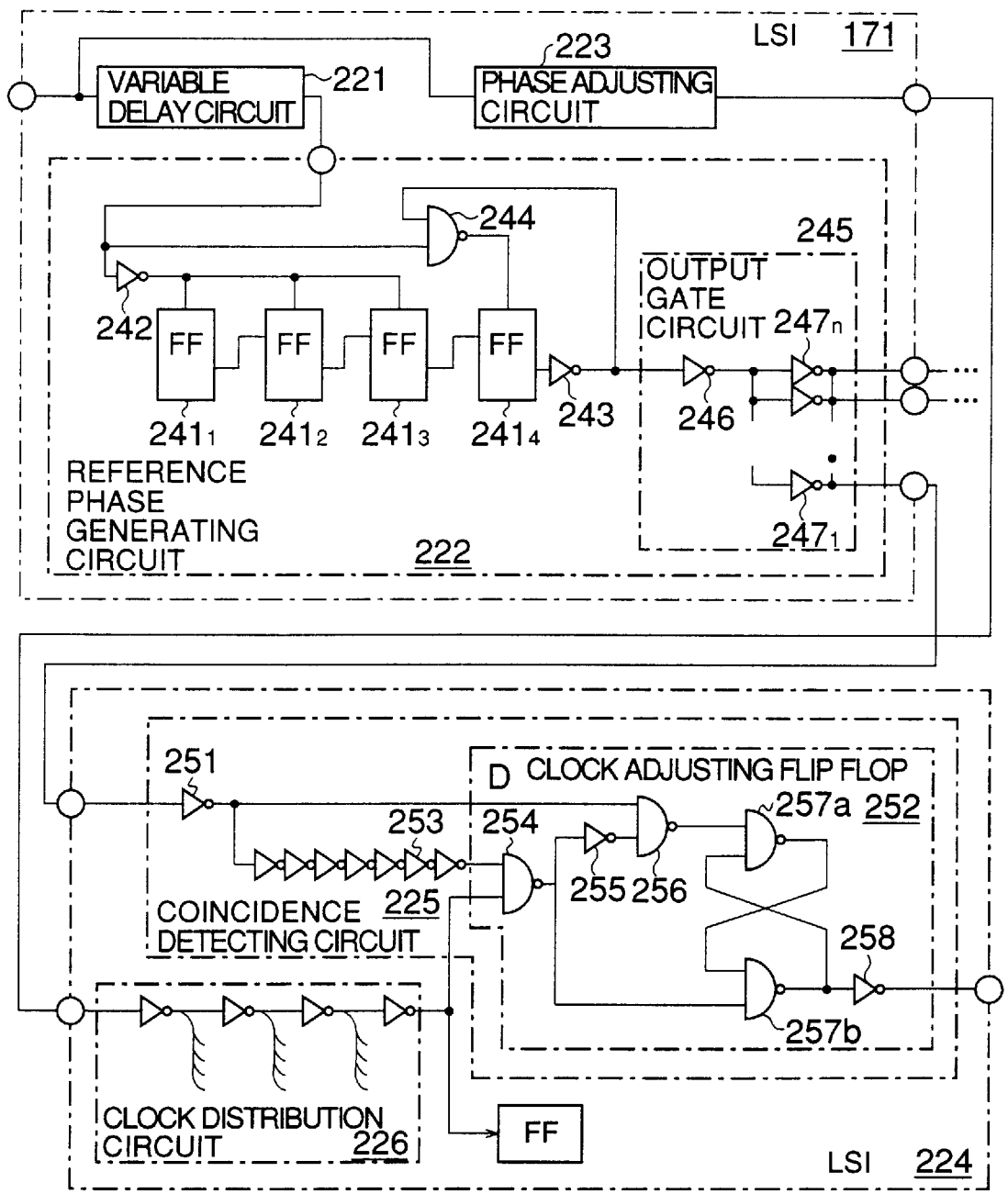

F I G. 18
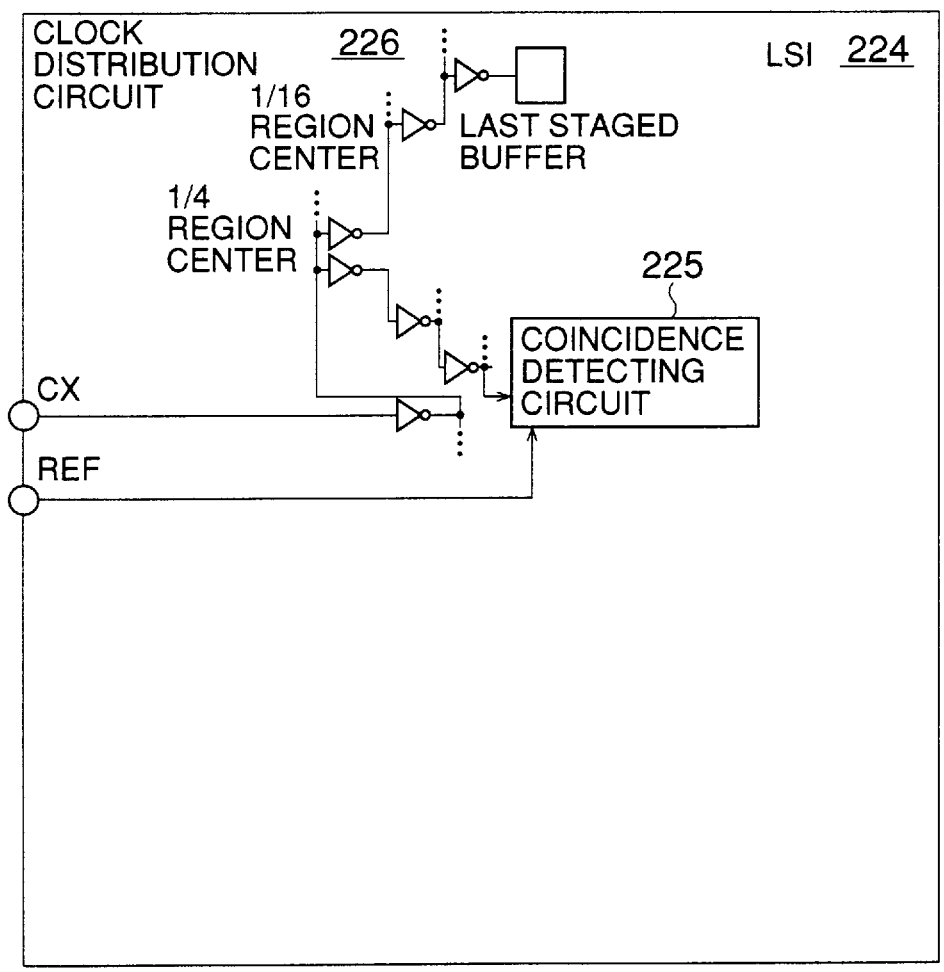

F I G. 2 1
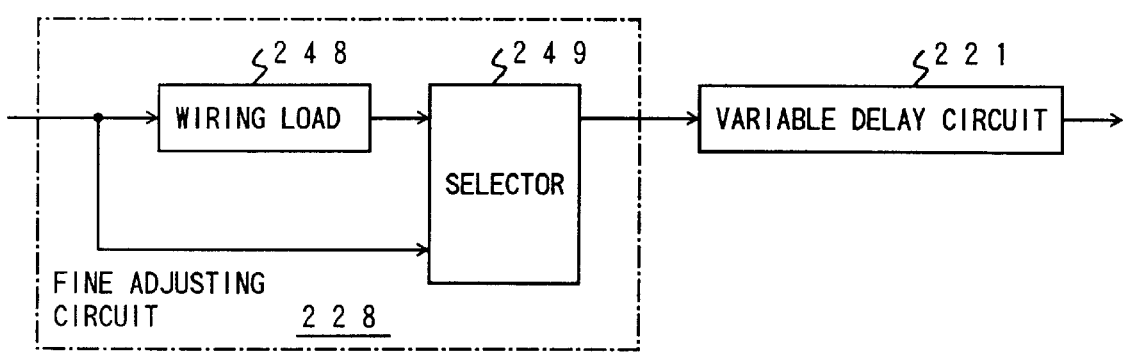

CLOCK SIGNAL ADJUSTING METHOD AND APPARATUS

BACKGROUND OF THE INVENTION (1) Field of the Invention

The present invention generally relates to a clock signal adjusting method and apparatus, and more particularly to a clock signal adjusting method and apparatus for adjusting a phase and a width of each of clock signals distributed to units provided in information processing units, such as a computer, and elements in the respective units.

In order to improve functions of information processing equipment, clock signals used to operate flip-flops in the information processing equipment are quickened. Specifically, in high-performance computers, it is necessary to distribute clock pulses to flip-flops therein at desired phases.

Due to the progress of the semiconductor processing technique in the recent years, the integration degree of CMOS-elements using very small power is increased. As a result, a large number of CMOS-elements are used in the information processing equipment. In the CMOS-elements, although the power is used for charge and discharge in load line capacitance in a logical state change, almost no power is used in an inactive state. Thus, the CMOS-elements have a characteristic by which the amount of generated heat in an active state greatly differ from that of generated heat in the inactive state. In addition, the operation property of each CMOS-element depends on the gate width which is the finest structure, so that the variation of the operation properties of the respective elements is greater than that of operation properties of bipolar elements. Also the variation of the operation properties of the respective CMOS-elements based on temperature is large.

Hence, in a case where CMOS-elements are used in the high-performance computer as described above, a technique for adjusting the pulse widths and the phases of the clock signals supplied to the respective units with regard to delay time variation in the CMOS-elements is needed, the delay time variation in the CMOS-elements depending on the amount of generated heat which varies in accordance with the frequency of the clock signal and the number of operated circuits in each unit.

(2) Description of the Related Art

In a conventional case where a high-performance computer system using high speed clock signals is developed, monitor terminals used to adjust phases of the clock signals are provided in respective units. Before each unit is mounted in the system, clock input terminals and the monitor terminals are connected to an instrument such as an oscilloscope, and the phase of the clock signals are then adjusted in each unit with making observations of phase differences between signals at the clock input terminals and the monitor terminals.

That is, in the above conventional case, before the computer system is shipped, an operator performs the adjusting of the phase of the clock signals by manual operations.

In addition, a technique for adjusting the phases of the clock signals after the computer system is completely assembled is disclosed in U.S. Pat. No. 5,003,256 (John F. Merrill). In this technique, clock pulses are supplied to latch points for measurement via different paths by using a bi-directional bus. The phase difference between clock pulses supplied to each latch point for measurement and clock pulses at a reference latch point is then calculated based on the phase difference between the clock signals supplied to each latch point and an output signal in response to them and test signals having predetermined delay times.

The above technique is essentially used to obtain the delay time for a single pulse, but is not used to measure the phase variation in a state, such as an operating state of the computer system, where the clock signals are continuously supplied to the system. Provided that a long burst signal is used as the clock pulse sequence, the phase difference can be measured under a temperature condition similar to a condition in which the computer system is being operated.

In the above conventional case where the operator performs the adjusting of the phase of the clock signals by manual operations before the computer system is shipped, the phases of the clock pulses can not be efficiently adjusted.

Due to the technique disclosed in the U.S. Pat. No. 5.003,256, the phases of the clock signals can be adjusted under a condition in which the computer system is completely assembled.

However, since this technique is essentially used to obtain the delay time of a single pulse, after applying the burst signal, the measurement is carried out based on the last pulse of the burst signal, at each latch point for measurement. That is, the measurement must be carried out under a condition in which the clock pulses are stopped. Thus, since the alternate applying and stop of the clock pulses must be repeatedly performed, a long time is required for the adjusting operation in all the latch points.

In addition, it is necessary to use external units, such as a unit for generating the burst signal and a unit for generating the test signals. Thus, a large amount of processing for communication with the external units is needed.

SUMMARY OF THE INVENTION

Accordingly, a general object of the present invention is to provide a novel and useful clock signal adjusting method and apparatus in which the disadvantages of the aforementioned prior art are eliminated.

A more specific object of the present invention is to provide a clock signal adjusting method and apparatus in which the phases of clock signals input to elements and pulse widths of the clock pulses can be accurately adjusted with a simple structure.

The above objects of the present invention are achieved by a clock signal adjusting method applicable to an information processing system in which clock signals are distributed from a clock generating unit to a plurality of load units, each of the plurality of load units having at least a load element operated in synchronism with a clock signal input to each of the load units, the clock signal adjusting method comprising steps of: (a) measuring delay times set in each of a plurality of delay means in accordance with setting instructions, the plurality of delay means being provided so as to corresponding to the load units, each of the plurality of delay means delaying an input signal by a delay time set therein; (b) inputting, based on measuring results obtained in the step (a), to the plurality of delay means setting instructions corresponding to delay times to be set in the plurality of delay means; (c) generating reference phase signals having predetermined phase differences based on outputs of the plurality of delay means; and (d) adjusting, based on phases of the reference phase signals generated in the step (c), a phase of the clock signal distributed for the load element in each of the load units.

The above objects of the present invention are also achieved by a clock signal adjusting apparatus applicable to an information processing system in which clock signals are distributed from a clock generating unit to a plurality of load units, each of the plurality of load units having at least a load element driven based on a clock signal input to each of the plurality of load units, the clock signal adjusting apparatus comprising: a plurality of delay means, provided so as to corresponding to the load units, for delaying input signals by delay times corresponding to setting instruction supplied thereto; delay measuring means for measuring delay times corresponding to setting instructions for each of the plurality of delay means; setting means for generating, based on measuring results obtained by the delay measuring means, setting instructions in accordance with phase adjusting instructions supplied thereto, the setting instructions corresponding to delay times to be set in the plurality of delay means, and for supplying the setting instructions to corresponding plurality of delay means; reference phase generating means for generating, based on the clock signals supplied thereto via corresponding plurality of delay means, reference phase signals having phase differences corresponding to the delay times set in the plurality of delay means; clock adjusting means for receiving the clock signals which are to be distributed to the load units and for delaying the clock signals by delay times corresponding to adjusting instructions so as to adjust the phases of the clock signals, each of adjusted clock signals being supplied, as an internal clock signal, to the load element in a corresponding one of the load units; coincidence detecting means, provided for each of the respective load units, for determining whether a phase of the reference phase signal and a phase of the internal clock signal in each of the load units; and adjusting control means for generating the adjusting instruction in accordance with a determination result obtained by the coincidence determining means and for supplying the adjusting instruction to the clock adjusting means.

According to the present invention, delay times which can be set in the delay means corresponding to each of the plurality of load units are measured, the delay means generates a delay time which can be specified, and the reference phase signal having the delay time is generated. Thus, the phase of the clock signal supplied to the load element in each of the load units is adjusted based on the reference phase clock, so that the clock signal having a desired phase difference can be supplied to the load unit in each of the load units. That is, phases of high speed clock signal can be accurately adjusted, so that the performance of the computer system can be accurately estimated. The present invention can be contributed to the development of high performance computers.

BRIEF DESCRIPTION OF THE DRAWINGS

Other objects, features and advantages of the present invention will become apparent from the following detailed description when read in conjunction with the accompanying drawings, in which:

FIG. 1 is a flow chart illustrating an example of a procedure of a clock signal adjusting method according to present invention;

FIG. 2 is a flow chart illustrating another example of a procedure of the clock signal adjusting method according to the present invention;

FIG. 11 is a block diagram illustrating an essential part of the clock signal adjusting apparatus as claimed in claims 18 and 19;

FIG. 14 is a block diagram illustrating a computer system to which the clock signal adjusting apparatus according to the present invention;

FIG. 15 is a block diagram illustrating a detailed constitution of a variable delay circuit shown in FIG. 14;

FIG. 16 is a block diagram illustrating detailed constitutions of a reference signal generating circuit and a coincidence detecting circuit;

FIG. 18 is a block diagram illustrating a detailed constitution of a clock distribution circuit shown in FIG. 16;

FIG. 21 is a block diagram illustrating a fine adjusting circuit;

DETAILED DESCRIPTION OF THE PRESENT INVENTION

Figure 3:
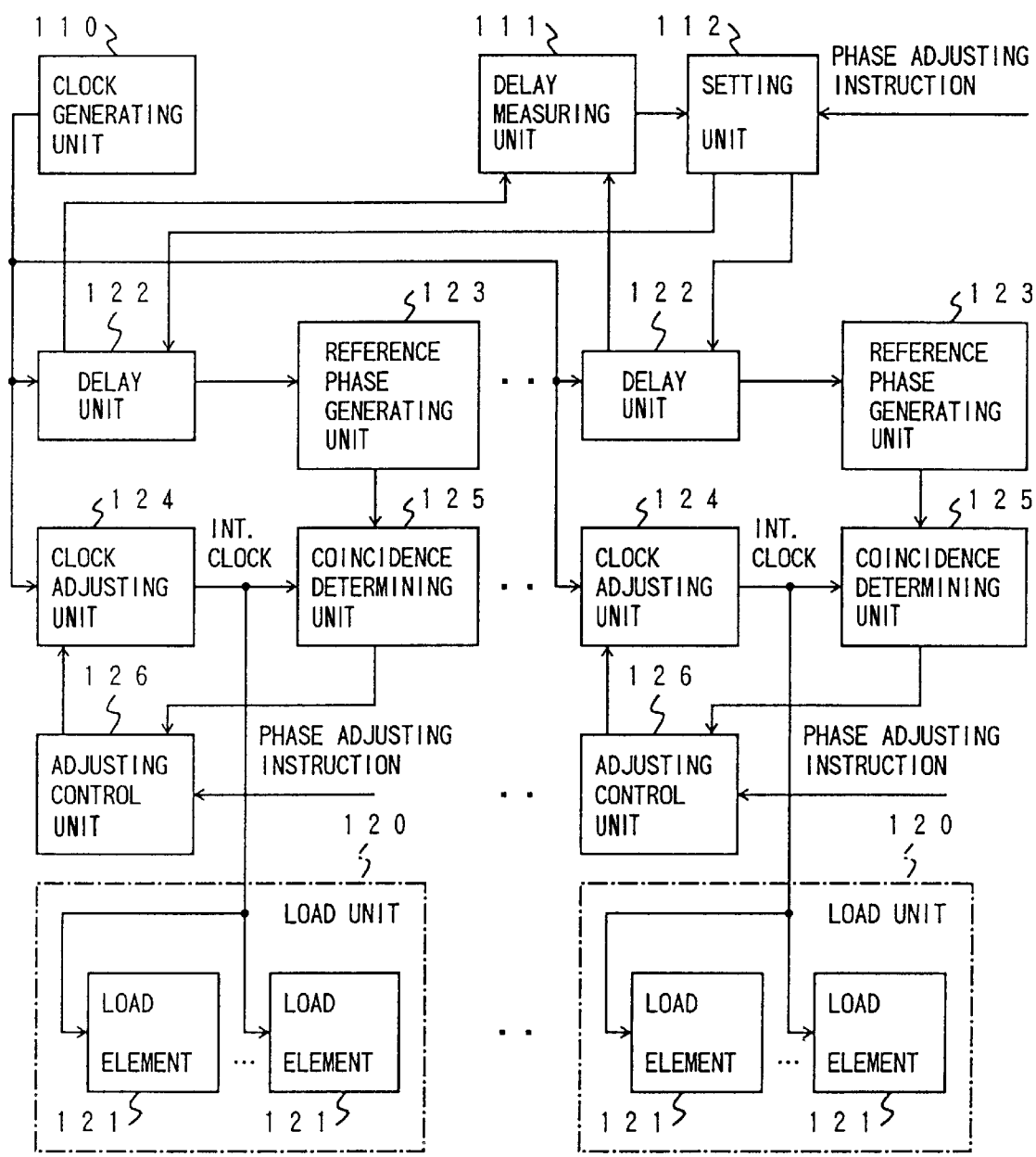
FIG. 3 is a block diagram illustrating a clock signal adjusting apparatus as claimed in claim 4.

A description will be given, with reference to FIGS. 1–13, of the principle of the claimed invention.

A clock signal adjusting method as claimed in claim 1 is executed as shown in FIG. 1.

The clock signal adjusting method is applicable to an information processing system in which clock signals are distributed from a clock generating unit to a plurality of load units, each of the plurality of load units having at least a load element operated in synchronism with a clock signal input to each of the load units. The clock signal adjusting method comprising steps of:

(S1) measuring delay times set in each of a plurality of delay means in accordance with setting instructions, the plurality of delay means being provided so as to correspond to the load units, each of the plurality of delay means delaying an input signal by a delay time set therein;

(S2) inputting, based on measuring results obtained in the step (S1), to the plurality of delay means setting instructions corresponding to delay times to be set in the plurality of delay means;

(S3) generating reference phase signals having predetermined phase differences based on outputs of the plurality of delay means; and (S4) adjusting, based on phases of the reference phase signals generated in the step (S3), a phase of the clock signal distributed for the load element in each of the load units.

According to the above method, the reference is phase signal having a phase is generated based on the signal supplied via the delay means, and the phase of the reference phase signal and the phase of the clock signal are made be coincident with each other. As a result, the phase of the clock signal is adjusted.

A clock signal adjusting method as claimed in claims 2 and 3 is executed as shown in FIG. 2.

In the clock signal adjusting method as claimed in claim 2, the step S1 in the above method has steps of:

(S11) forming a loop including each of the plurality of delay means corresponding to the load units; and (S12) measuring the delay time in each of the plurality of delay means corresponding to the load units, based on an oscillating frequency obtained when a single pulse is supplied to the loop obtained in the step (S11).

According to this method, the delay times in the plurality of delay means can be measured in the same scale, so that absolute values of the delay times can be obtained.

In the clock signal adjusting method as claimed in claim 3, the loop further includes another delay means generating a delay time which is greater than the delay time generated by each of the delay means corresponding to the load units. The method further comprising steps of:

(S13) detecting at least two delay times by which the phase of the reference phase signal and the phase of the clock signal are coincident with each other while the delay time in each of the plurality of delay means is being changed; and (S14) correcting a measurement value of the delay time in each of the plurality of delay means, based on a difference between the delay times detected in the step (S13) and the frequency of the clock signal.

According to this method, the delay times can be measured under a condition in which the variation of operation environment of the plurality of delay means is small, so that the delay times can be accurately measured.

A clock signal adjusting apparatus as claimed in claim 4 is formed as shown in FIG. 3.

The clock signal adjusting apparatus is applicable to an information processing system in which clock signals are distributed from a clock generating unit 110 to a plurality of load units 120, each of the plurality of load units 120 having at least a load element 121 driven based on a clock signal input to each of the plurality of load units 120. the clock signal adjusting apparatus comprising:

a plurality of delay means 122, provided so as to correspond to the load units 120, for delaying input signals by delay times corresponding to setting instruction supplied thereto;

delay measuring means 111 for measuring delay times corresponding to setting instructions for each of the plurality of delay means 122;

setting means 112 for generating, based on measuring results obtained by the delay measuring means 111, setting instructions in accordance with phase adjusting instructions supplied thereto, the setting instructions corresponding to delay times to be set in the plurality of delay means 122, and for supplying the setting instructions to corresponding plurality of delay means 122;

reference phase generating means 123 for generating, based on the clock signals supplied thereto via corresponding plurality of delay means 122, reference phase signals having phase differences corresponding to the delay times set in the plurality of delay means 122;

clock adjusting means 124 for receiving the clock signals which are to be distributed to the load units 120 and for delaying the clock signals by delay times corresponding to adjusting instructions so as to adjust the phases of the clock signals, each of adjusted clock signals being supplied, as an internal clock signal, to the load element 121 in a corresponding one of the load units 120;

coincidence determining 125 means, provided for each of the respective load units 120, for determining whether a phase of the reference phase signal and a phase of the internal clock signal in each of the load units 120; and adjusting control means 126 for generating the adjusting instruction in accordance with a determination result obtained by the coincidence determining means 125 and for supplying the adjusting instruction to the clock adjusting means 124.

According to this clock signal adjusting apparatus, the clock signals having desired phases can be supplied to load elements 121 in the respective load units 120.

Figure 4:
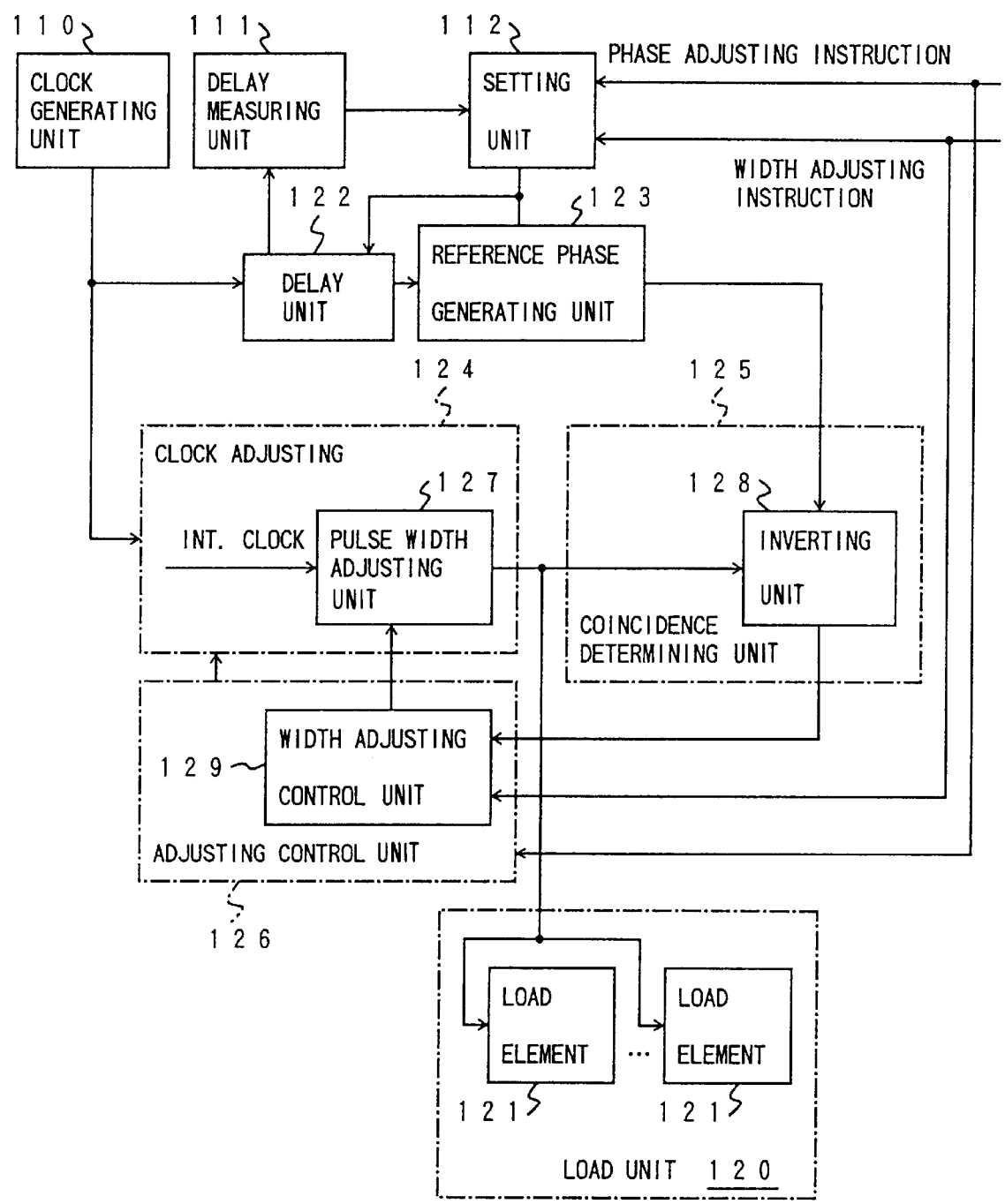
FIG. 4 is a block diagram illustrating the clock signal adting apparatus as claimed in claim 5.

The clock signal adjusting apparatus as claimed in claim 5 is formed as shown in FIG. 4.

In the clock signal adjusting apparatus as claimed in claim 5, the setting means 112 further generates, based on the measurement results, setting instructions corresponding to specified widths in accordance with width adjusting instructions and supplies the setting instructions to corresponding plurality of delay means 122. The clock adjusting means 124 has pulse width adjusting means 127, operated in accordance with the width adjusting instructions, for changing pulse widths of the internal clock pulses in accordance with width changing instructions, and for outputting the internal clock pulses having the changed pulse widths. The coincidence determining means 125 has inverting means 128 for inverting a logical relationship between the phase reference signal and the internal clock signal based on the width adjusting instruction, the coincidence determining means 125 determining whether or not phases of the reference phase signal and the internal clock signal which are inverted by the inverting means 128 are coincident with each other. The adjusting control means 126 has width adjusting control means 129, operated in accordance with the width adjusting instructions, for generating the width changing instructions in accordance with determination results obtained by the coincidence determining means 125 and for supplying the width changing instructions to sid pulse width adjusting means 127.

According to this clock signal adjusting apparatus, after the phases of the clock signals are adjusted, the setting means 112 supplies the setting instructions corresponding to the desired pulse width to the delay means 122 corresponding to the respective load units 120. As a result, the widths of the clock signals are adjusted.

Figure 5:
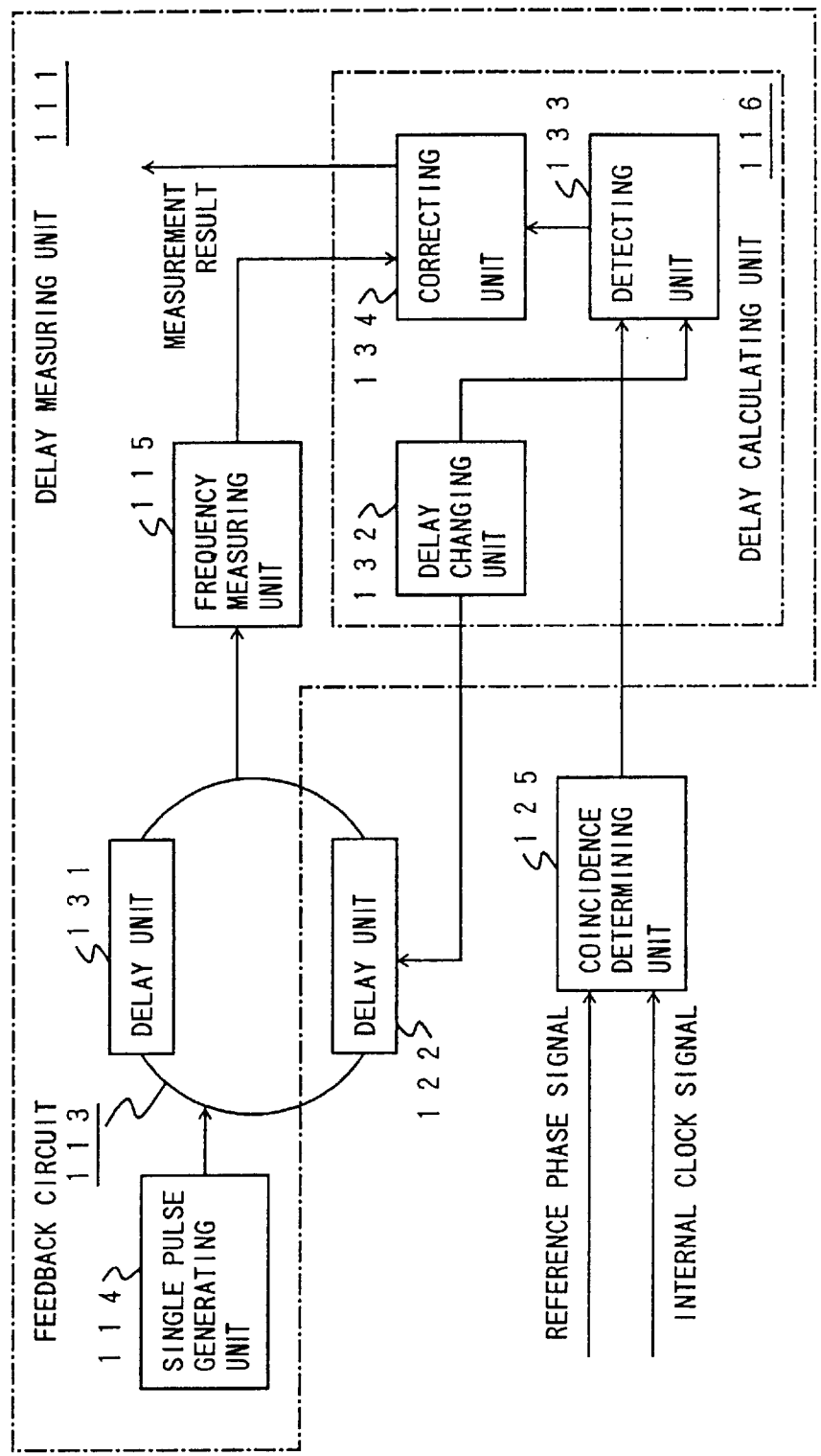
FIG. 5 is a block diagram illustrating an essential part of the clock signal adjusting apparatus as claimed in claims 6–9.

Essential parts of the clock signal adjusting apparatus as claimed in claims 6–9 are shown in FIG. 5.

In the clock signal adjusting apparatus as claimed in claim 6, the delay measuring means 111 comprises:

feedback circuits 113 forming loops including the delay means 122 corresponding to the load units 120;

single pulse generating means 114 for supplying single pulses to the loop formed by the feedback circuits 113;

frequency measuring means 115 for oscillating frequencies caused by the single pulses in the respective loops; and delay calculating means 116 for calculating the delay times in the delay means 122 included in the respective loops.

According to this clock signal adjusting apparatus, the delay times in the plurality of delay means 122 can be estimated in the same scale, so that absolute values of the delay times can be obtained.

In the clock signal adjusting apparatus as claimed in claim 7, the frequency measuring means 115 measures a plurality of times each of the oscillating frequencies, an average of a plurality of measured oscillating frequencies being supplied, as the measurement result, to the delay calculating means 116.

According to this clock signal adjusting apparatus, the oscillating frequency is decided based on the average of a plurality of measurement results. Thus, effect of noises is restrained, so that the measurement accuracy of the delay time can be improved.

In clock signal adjusting apparatus as claimed in claim 8, each of the feed back circuits 113 set forth in claim 6 further has another delay means 131 for providing a delay time greater than each of the delay times in the plurality of delay means 122. In addition, the delay calculating means 116 comprises:

delay changing means 132 for changing each of the delay times provided by the plurality of delay means 122 within a rage corresponding to at least one period of the clock signal;

detecting means 133, receiving from the delay changing means 133 information regarding delay times in the delay means 122, for detecting a plurality of delay times set in the delay means 122 when the phases of the clock signals and the reference phase signals are coincident with each other, based on the determination results obtained by the coincidence determining means 125 corresponding the load units 120; and correction means 134 for correcting the measurement result of the delay time calculated from the frequency obtained by the frequency measuring means 115, based on differences among the plurality of delay times obtained by the detecting means 133 and the periods of the clock signals.

According to this apparatus, due to addition of the delay means to the feedback circuit 113, the oscillating frequency can be decreased. As a result, the measurement accuracy of the delay time can be improved. Further, the operation environment of the delay means 122, that is, the variation of the delay time caused by the frequencies at which the delay means 122 are operated is known, so that the accurate delay time can be obtained.

In the clock signal adjusting apparatus as claimed in claim 9, the delay changing means 132 set forth in claim 8 repeatedly execute a changing operation for the delay time in each of the plurality of delay means 122, wherein the detecting means 133 detects a number of sets of delay times, the number corresponding to a number of times which the change of delay time is repeated, the plurality of sets of delay times being supplied, as the detecting results, to the correcting means, and wherein the correcting means 134 calculates a difference among the delay times in each of the sets and corrects the delay time based on an average of the difference and the period of the clock signal.

According to this apparatus, the detecting operation and the correcting operation are respectively repeated plural times, and the measurement values are averaged. As a result, the measurement accuracy of the delay time can be improved.

Figure 6:
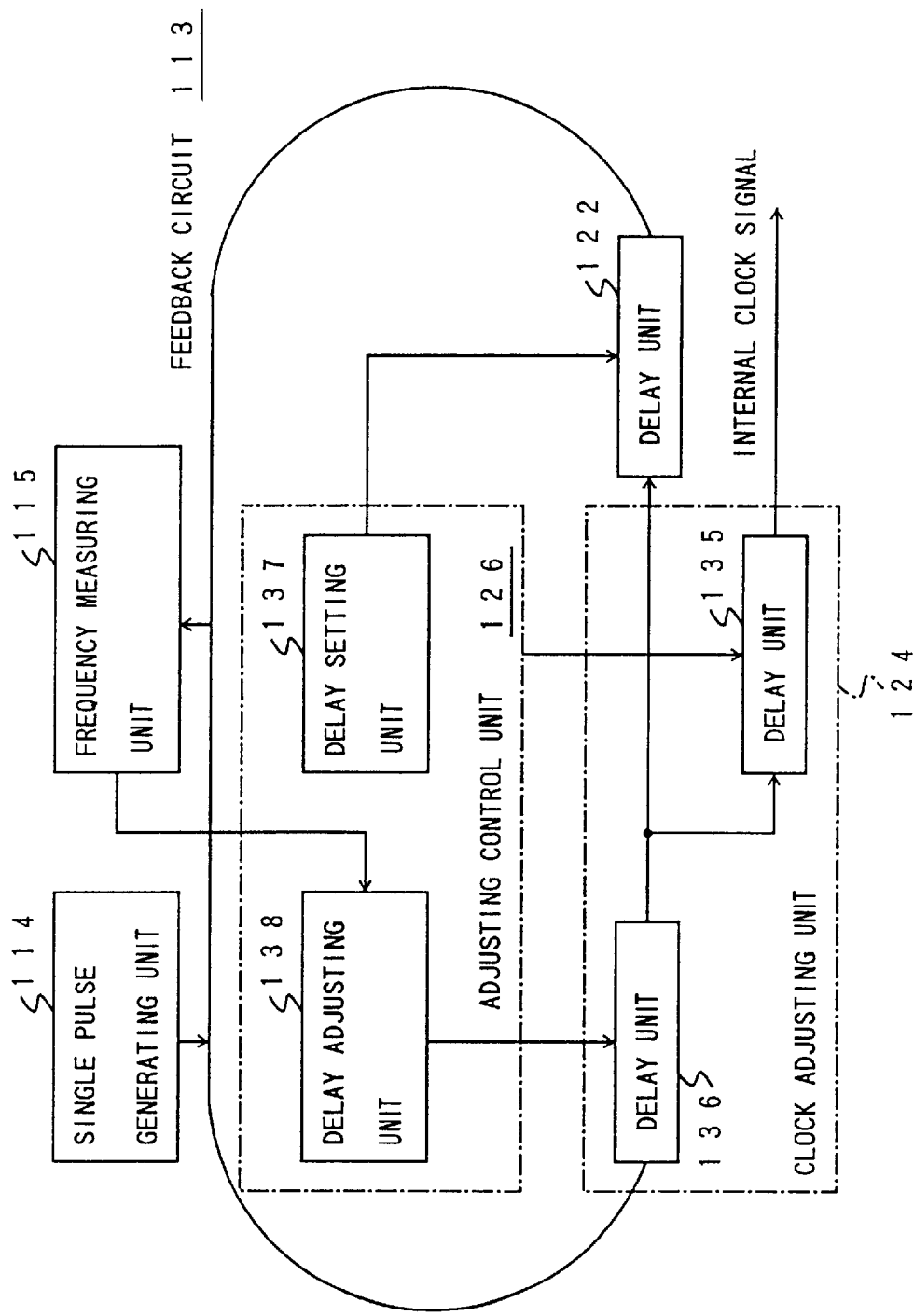
FIG. 6 is a block diagram illustrating an essential part of the clock signal adjusting apparatus as claimed in claims 10 and 11.

FIG. 6 shows an essential part of the clock signal adjusting apparatus as claimed in claims 10 and 11.

In the clock signal adjusting apparatus as claimed in claim 10, the clock adjusting means 124 in claim 6 comprises:

first delay means 135 for delaying an input signal by a delay time in accordance with the adjusting instruction and for outputting a delay signal as an internal clock signal;

second delay means 136 for delaying the clock signal supplied from the clock generating means 110 by a delay time which is variable and for supplying delayed clock signal to the first delay means 135 and the delay means 122, wherein the feedback circuit 113 forms loops including the delay means 122 and the second delay means 136, and wherein the adjusting control means 126 comprises:

delay setting means 137 for supplying to the delay means 122 a setting instruction corresponding to a predetermined delay time; and delay adjusting means 138 for, in each loop including the delay means 122 and the second delay means 136, adjusting the delay time in the first delay means 136 based on the oscillating frequency obtained by the frequency measuring means 115.

According to this apparatus, when the second delay means 136 is controlled by the delay adjusting means 138 so that the oscillating frequency in each loop is equal to the frequency $f_s$, the clock signals having the same phase can be distributed to the load units 120. In addition, the delay time in the first delay means 135 is adjusted, even if the phase of the internal signal is varied in each of the load units, the phase of the internal clock signal can be adjusted.

In the clock signal adjusting apparatus as claimed in claim 11, the delay setting means 137 set forth in claim 10 supplies to the delay means 122 the setting instruction corresponding to the delay time which is a sum of the phase specified for a corresponding load unit 120 and a predetermined standard delay time.

According to this apparatus, the clock signal having a phase varied from the standard phase by a desired phase can be supplied to the corresponding load unit 120.

Figure 7:
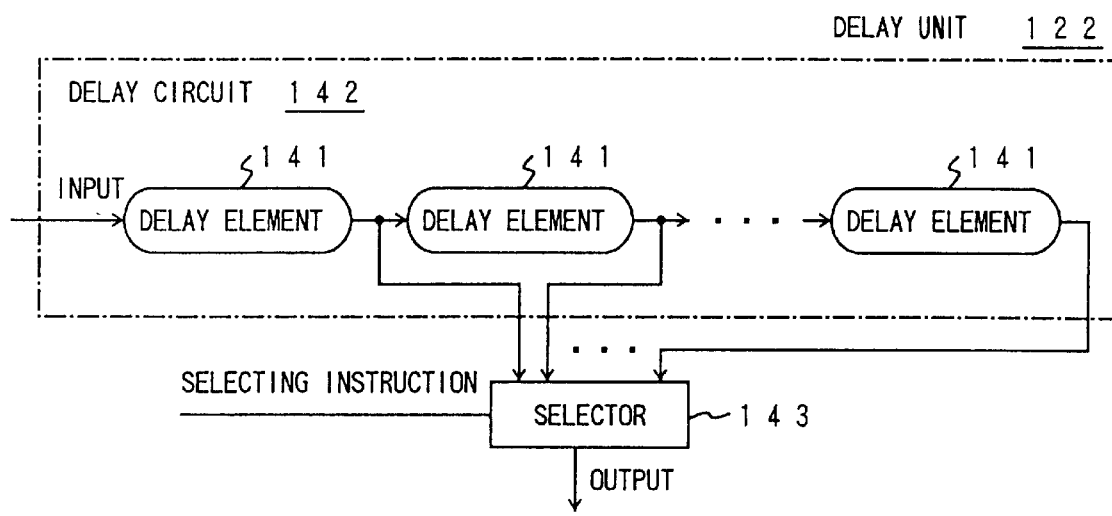
FIG. 7 is a block diagram illustrating an essential part of the clock signal adjusting apparatus as claimed in claim 12.

FIG. 7 shows an essential part of the clock signal adjusting apparatus as claimed in claim 12.

In the clock signal adjusting apparatus as claimed in claim 12, each of the plurality of delay means 122 comprises:

a delay circuit 142 formed of a plurality of delay elements 141 serially connected to each other, each of the plurality of delay elements 141 making a predetermined delay; and a selector 143 for outputting one of outputs of the plurality of delay elements 141 in accordance with the setting instruction.

According to this apparatus, since the plurality of delay elements 141 are serially connected to each other in the delay circuit 142, the delay elements 141 are operated under the same condition. Thus, the variation of the delay times can be reduced. In addition, the output of each of the delay elements are selected by the selector 143, the delay circuit 142 can be easily controlled by use of a digital control circuit.

Figure 8:
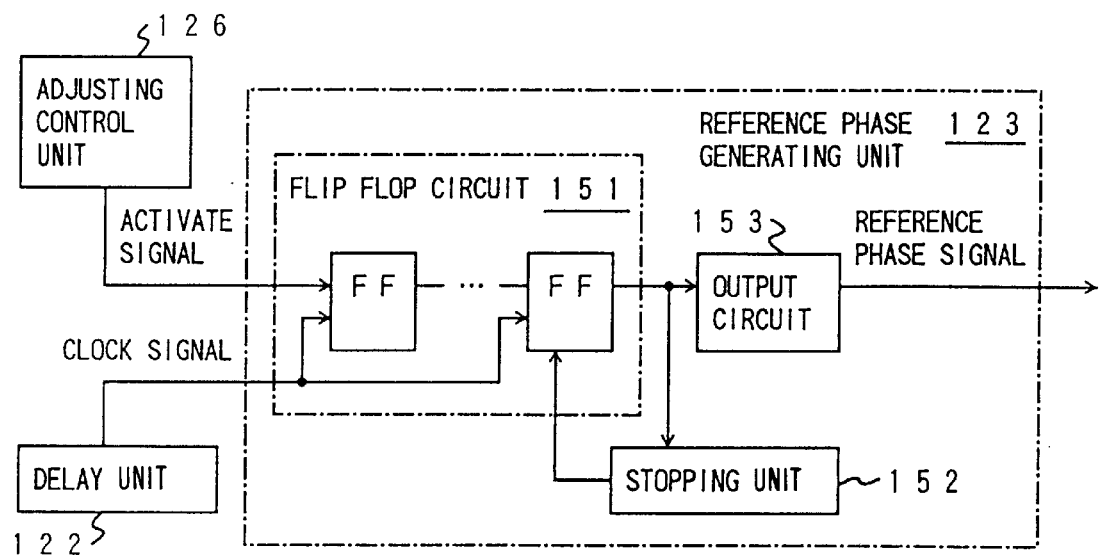
FIG. 8 is a block diagram illustrating an essential part of the clock signal adjusting apparatus as claimed in claims 13 and 14.

FIG. 8 shows an essential part of the clock signal adjusting apparatus as claimed in claims 13 and 14.

In the clock signal adjusting apparatus as claimed in claim 13, the adjusting control means 126 supplies to a corresponding reference phase generating means 123 a start signal in which a logical state is changed in a predetermined timing in accordance with the phase adjusting instruction, and wherein the reference phase generating means 123 comprises:

a flip flop circuit 151 formed of a plurality of flip flops, the state of the start signal supplied to a first staged flip flop being transmitted to a last staged flip flop in the flip flop circuit 151 in synchronism with the clock signal supplied from a corresponding delay means 122;

stopping means 152 for stopping an operation of the last staged flip flop in accordance with the changing state of the last staged flip flop; and an output circuit 153 for outputting an output of the flip flop circuit 151 as the reference phase signal.

According to this apparatus, the reference phase signal in which the logical state is changed once in synchronism with the clock signal from the delay means 122 can be generated.

In the clock signal adjusting apparatus as claimed in claim 14, the output circuit 135 provided in each of the reference phase generating means 123 outputs a signal having an edge at which a level is changed in a direction equal to a direction in which a level of the clock signal to be processed by the coincidence determining means 125 is changed at an edge.

According to this apparatus, the edge of the reference phase signal can be adjusted on the edge of the signal to be processed by the coincidence determining means 125.

Figure 9:
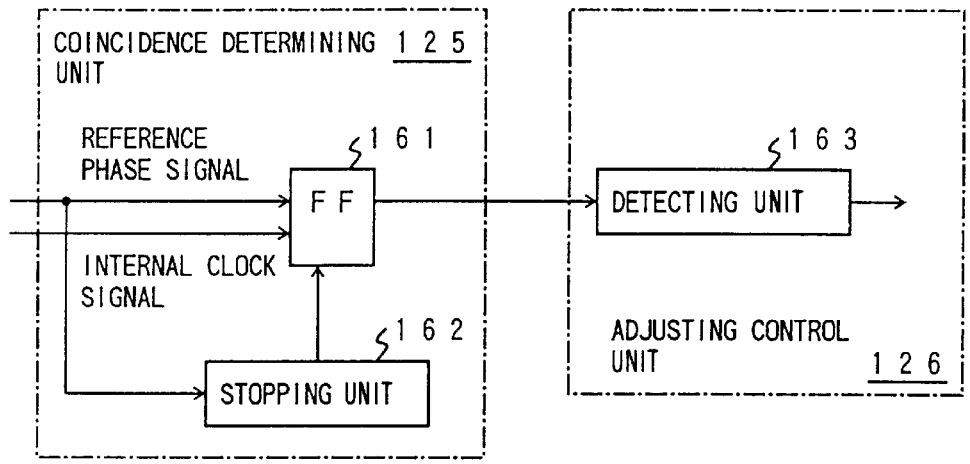
FIG. 9 is a block diagram illustrating an essential part of the clock signal adjusting apparatus as claimed in claims 15 and 16.

FIG. 9 shows an essential part of the clock signal adjusting apparatus as claimed in claims 15 and 16.

In the clock signal adjusting apparatus as claimed in claim 15, each of the coincidence determining means 125 comprises:

a flip flop 161 for taking a logical state of the phase reference signal in synchronism with predetermined edges of the internal clock signal supplied thereto; and stopping means 162 for supplying an instruction to the flip flop 161 to stop an operation of sid flip flop 161 after a predetermined time elapses from a time at which the logical state of the phase reference signal is changed.

According to this apparatus, it can be rapidly determined whether or not the phases of the internal clock signal and the reference phase signal are coincident with each other.

In the clock signal adjusting apparatus as claimed in claim 16, the adjusting control means 126 in claim 15 comprises:

detecting means 163, when the output of the flip flop 161 is changed from a first logical state which has been maintained for a time greater than a predetermined time corresponding to a phase difference to a second logical state, and is then maintained at the first logical state for a time greater than the predetermined time, for detecting a delay time corresponding to the phase difference.

According to this apparatus, a narrow pulse corresponding to a time from change of the logical state of the reference phase signal to stop of the flip flop 161 by means of the stopping means 162 is eliminated as a noise. Thus, a point at which the phases of the internal clock signal and the reference phase signal are coincident with other can be accurately detected.

Figure 10:
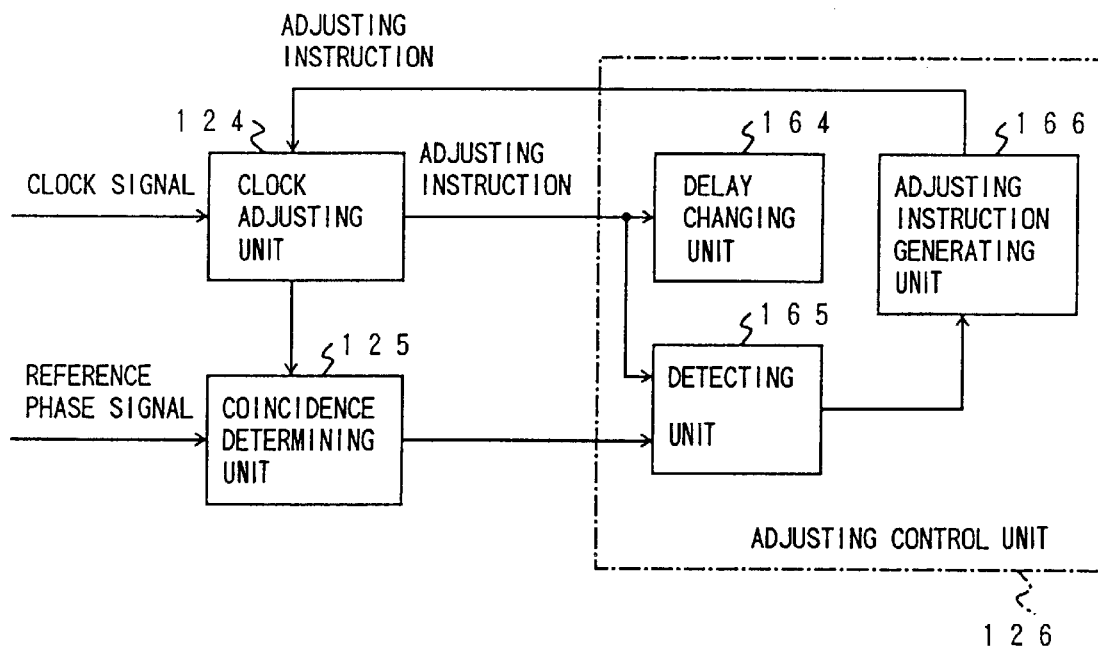
FIG. 10 is a block diagram illustrating an essential part of the clock signal adjusting apparatus as claimed in claim 17.

FIG. 10 shows an essential part of the clock signal adjusting apparatus as claimed in claim 17.

In the clock signal adjusting apparatus as claimed in claim 17, the adjusting control means 126 set forth in claim 4 comprises:

delay changing means 164 for supplying the adjusting instruction to the clock adjusting means 124, and for carrying out, at least once, a process for changing the delay time by the clock adjusting means 124 within a predetermined range;

detecting means 165 for detecting, based on the determination result obtained by the coincidence determining means 125 and the adjusting instruction, a delay time by which the phases of the clock signal and the reference phase signal are coincident with each other; and adjusting instruction generating means 166 for, every time the delay changing means 164 carries out the process for changing the delay time, totalizing at least one delay time detected by the detecting means 165 and for generating an adjusting instruction corresponding to an average of at least the delay time as the adjusting instruction to be used, the adjusting instruction being supplied to the clock adjusting means 124.

According to this apparatus, the phase of the clock signal can be accurately adjusted.

FIG. 11 shows an essential part of the clock signal adjusting apparatus as claimed in claims 18 and 19.

In the clock signal adjusting apparatus as claimed in claim 18, the load element 121 provided in each of the plurality of load units 120 includes the coincidence determining means 125, wherein the clock adjusting means 124 has a delay circuit 144, corresponding to the load element 121 in each of the load units 120, for delaying the clock signal by a delay time in accordance with the adjusting instruction and for outputting a delayed clock signal as the internal clock signal, wherein the adjusting control means 126 generates the adjusting instruction to be supplied to the delay circuit 144, in accordance with the determination result obtained by the coincidence determining means 125 corresponding to the load element 121 in each of the load units 120, and wherein each of the load units 120 comprises:

an LSI element 171, in which the delay means 122, the reference phase generating means 123 and the clock adjusting means 124 are integrated, having a clock terminal for the internal clock signal supplied to the load element 121 and a reference signal terminal for the reference phase signal;

a reference phase distribution network 172 through which the reference phase signal output from the reference signal terminal is transmitted to the load element 121; and a clock distribution network 173 through which the internal clock signal output from the clock terminal is transmitted to the load element 121.

According to this apparatus, the phases of the internal clock signals distributed to the load elements can be independently adjusted. The degree of freedom of design of the clock distribution network 173 can be increased. In addition, since the delay means 122, the reference phase generating means 123 and the clock adjusting means 124 are integrated into the LSI element 171, the total length of wiring lines among the above means and the coincidence determining means 125 can be minimized. Further, due to the improvement of the structure of the reference phase distribution network 172, the phase difference between the reference phase signals distributed to the coincidence determining means 125 of the respective load elements 121 can be small.

In the clock signal adjusting apparatus as claimed in claim 19, the LSI element 171, set forth in claim 18, corresponding to each of the plurality of load units 120 has one or a plurality of buffer elements 174, corresponding to the reference signal terminal, for maintaining an output current required for output of the reference phase signal, output terminals of the one or plurality of buffer elements 174 being shortened, and wherein the reference phase distribution network 172 corresponding to the the plurality of load units 120 has wiring lines connecting the respective reference terminals to the load elements 121, the wiring lines having the same length.

According to this apparatus, the output terminals of the buffer elements 174 corresponding to the respective reference signal terminals are shortened and the wiring lines, in the reference phase distribution network 172, connected to the respective load elements 121 have the same length, the variation of the reference phase signal can be decreased.

In the clock signal adjusting apparatus as claimed in claim 20, the reference phase distribution network 172, set forth in claim 18, corresponding to the plurality of load units has a wiring line connecting at least a reference signal terminal to a corresponding load element 121 is shortened at at least one point.

According to this apparatus, it is guaranteed that the reference phase signals distributed to the respective load elements 121 are synchronized with each other.

Figure 12:
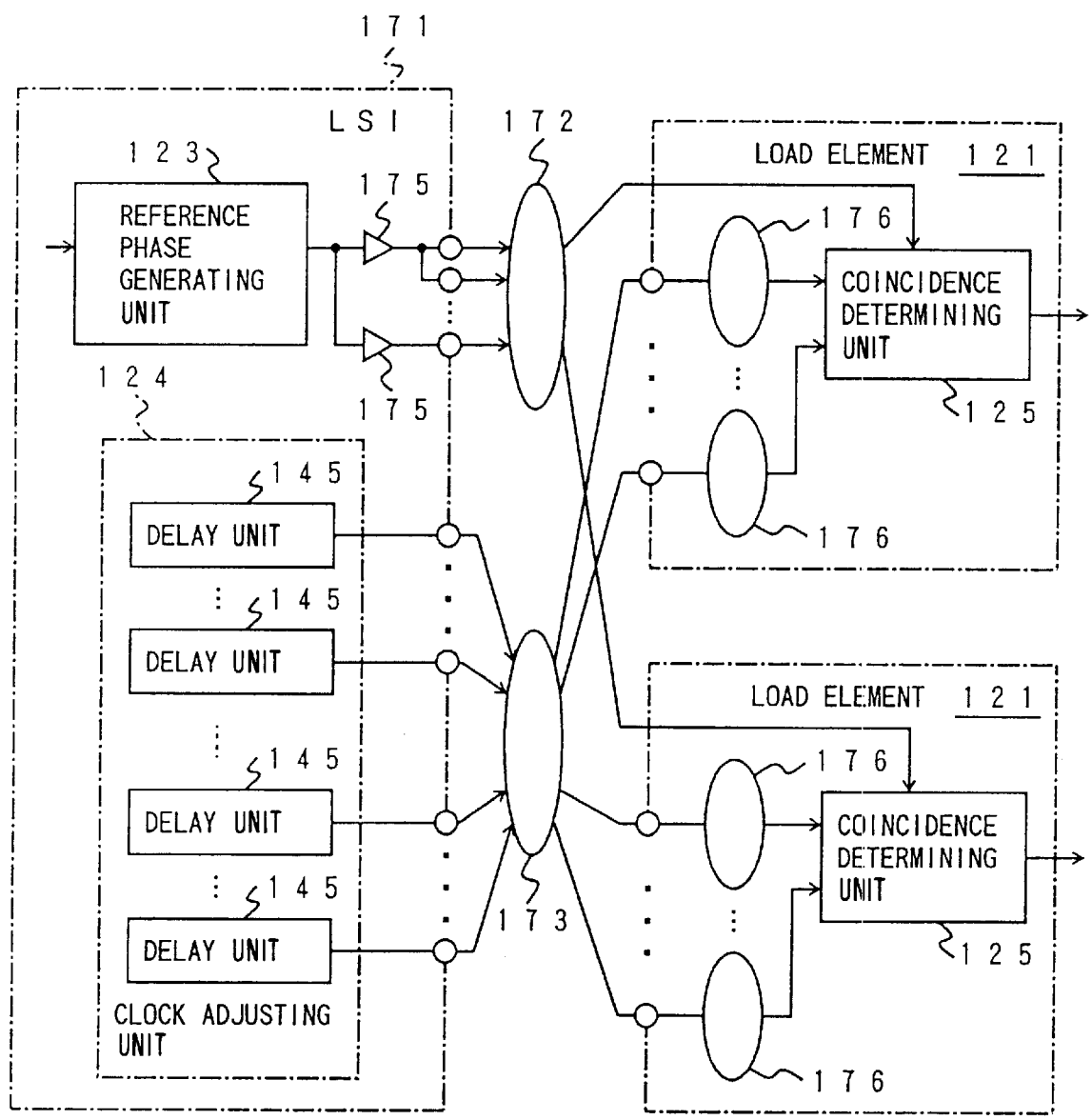
FIG. 12 is a block diagram illustrating an essential part of the clock signal adjusting apparatus as claimed in claims 21 and 22.

FIG. 12 shows an essential part of the clock signal adjusting apparatus as claimed in claims 21 and 22.

In the clock signal adjusting apparatus as claimed in claim 21, the LSI element 171, set forth in claim 18, corresponding to each of the plurality of load units 120 has at least one buffer element 175 for maintaining an output current required for output of the reference phase signal to at least one load element 121 and for outputting the reference signal to the load element 121.

According to this apparatus, it is guaranteed that the reference signals distributed to the load units 121 corresponding to the reference signal terminals can be synchronized with each other.

In the clock signal adjusting apparatus as claimed in claim 22, at least one load element 121 provided in each of the plurality of load units 120 has at least one internal distribution network 176 for distributing the internal clock signal to a plurality of flip flops provided in the load element 121, wherein the coincidence determining means 125 determines whether or not the phase of internal clock signal and the phase of the reference phase signal are coincident with each other, wherein the clock adjusting means 124 has delay means 145, corresponding to the internal distribution in the internal distribution network 176 in the load element 121 provided in the corresponding load unit 120, for delaying the clock signal by a delay time corresponding to the adjusting instruction supplied thereto, and wherein the adjusting control means 126 generates the adjusting instruction to be supplied to the delay means 145, based on the determination result, corresponding to the internal distribution network 176, obtained by the coincidence determining means 125 provided in the load element 121.

According to this apparatus, the clock signal supplied to the flip flop in each of the load elements 121 can be estimated. In addition, the coincidence determining means 125 determines whether or not the phase of the internal clock signal transmitted through the internal distribution network 176 and the phase of the reference phase signal are coincident with each other, and the delay means 145 is adjusted. As a result, the phase of the clock signal can be adjusted coping with characteristics of each of the load units 120.

Figure 13:
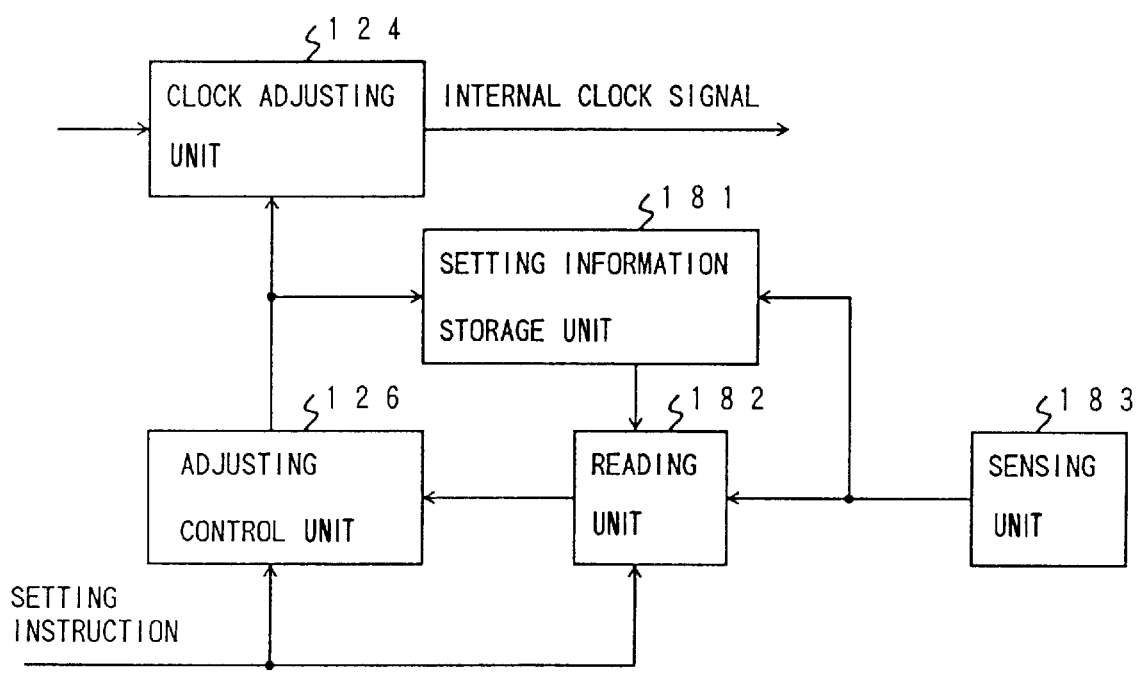
FIG. 13 is a block diagram illustrating an essential part of the clock signal adjusting apparatus as claimed in claims 23 and 24.

FIG. 13 shows an essential part of the clock signal adjusting apparatus as claimed in claims 23 and 24.

The clock signal adjusting apparatus as claimed in claim 23 has elements claimed in claim 4 and further comprises:

setting information storage means 181 for storing setting information regarding a last state which is set in the clock adjusting means 124 after the adjusting control means 126 finishes the adjusting operation; and reading means 182 for reading out the setting information from the setting information storage means 181 in accordance with a setting instruction, the setting information read from the setting information storage means 181 being supplied to the adjusting control means 126, wherein the adjusting control means 126 generates the adjusting instruction corresponding to the setting information from the reading means 182 in accordance with the setting instruction, the adjusting instruction being supplied to the clock adjusting means 124.

According to this apparatus, the setting information is set in the setting information storage means 181 after the adjusting operation of the adjusting control means 126. Thus, the reading means 182 reads out the setting information from the setting information storage means 181 in accordance with the setting instruction, and the adjusting control means 126 carries out the setting operation for the clock adjusting means 124. In this case, the same results as in the adjusting operation described above are obtained.

The clock signal adjusting apparatus as claimed in claim 24 has elements claimed in claim 23 and further comprises:

sensing means 183 for sensing environment in which the information processing unit is installed, wherein the setting information storage means 181 receives environment information regarding the environment sensed by the sensing means 183 and stores setting information items corresponding to different environment information items, and wherein the reading means 182 reads out the setting information items corresponding to the environment information item obtained by the sensing means 183.

According to this apparatus, in a case where setting information items corresponding to various environments are stored in the setting information storage means 181, a suitable setting information item is retrieved from the setting information storage unit 183 and the suitable setting information can be used for the clock adjusting means 124.

DESCRIPTION OF THE PREFERRED EMBODIMENTS

A description will now be given of an embodiment of the present invention.

FIG. 14 shows a computer system to which a clock signal adjusting apparatus is applied. Referring to FIG. 14, the computer system has a clock unit 210, units 220, a service processor 231, an adjustment processing program 232 and a delay time table 233. In this embodiment, a unit 220 may be used as a general term for the n units 220 for the sake of simplicity.

The clock unit 210, corresponding to the clock generating unit 110 shown in FIGS. 3 and 4, generates clock signals. The clock signals are distributed to the n units $220_1$–$220_n$ corresponding to the load units 120 shown in FIGS. 3 and 4. The service processor 231 controls the clock unit 210 and the unit 220 in accordance with the adjustment processing program 232. That is, the service processor 231 carries out a phase adjusting process which will be described later.

Each unit 220 has a variable delay circuit 221 corresponding to the delay means 122 shown in FIGS. 3 and 4. The variable delay circuit 221 is formed as shown in FIG. 15. Referring to FIG. 15, the variable delay circuit 221 delays an input signal for a delay time corresponding to a total sum of delay time intervals for respective taps extending to a selected tap. The output of the variable delay circuit 221 is supplied to a reference phase generating circuit 222 which will be described later and is fed back to the clock unit 210.

The unit 220 further has the reference phase generating circuit 222, m phase adjusting circuits $223_1$–$223_m$ and m LSIs $224_1$–$224_m$. The clock signal input to the unit 220 is distributed to the LSIs $224_1$–$224_m$ via the phase adjusting circuits $223_1$–$223_m$. The reference phase adjusting circuit 222, corresponding to the reference phase generating means 123 shown n FIGS. 3 and 4, generates a reference phase signal based on the output of the variable delay circuit 221. The reference phase signal is distributed from the reference phase generating circuit 222 to the LSIs $224_1$–$224_m$.

Hereinafter, a phase adjusting circuit 223 and an LSI 224 are respectively used as general terms for the phase adjusting circuits $223_1$–$223_m$ and the LSIs $224_1$–$224_m$ for the sake of simplicity.

The structure of the unit 220 corresponds to that shown in FIG. 11, and an LSI 171 in which the variable delay circuit 221, the reference phase generating circuit 222 and the phase adjusting circuit 223 are integrated is mounted in the unit 220. Each LSI 224 is provided with a coincidence detecting circuit 225 corresponding to the coincidence determination means 125 shown in FIGS. 3 and 4. In FIG. 14, the coincidence detecting circuit 225 is not shown.

In addition, in FIG. 14, the clock unit 210 has a crystal controlled oscillator 211, a selector 213, a wave shaping circuit 214 and phase adjusting circuits $212_1$–$212_n$. The selector 213 selects either a feed-back signal from the unit 220 or the output signal from the crystal controlled oscillator 211. The signal selected by the selector 213 is distributed to the phase adjusting circuits $212_1$–$212_n$ via the wave shaping circuit 215. The respective output signals from the phase adjusting circuits $212_1$–$212_n$ are supplied to the corresponding units $220_1$–$220_n$.

The clock unit 210 further has a single pulse generating circuit 216 and a frequency counter 217. The single pulse generating circuit 216, corresponding to the single pulse generating means 114 shown in FIGS. 5 and 6, generates a single pulse in accordance with an instruction from the service processor 231. The single pulse is supplied from the single pulse generating circuit 216 to the wave shaping circuit 215. The frequency counter 217, corresponding to the frequency counting means 115 shown in FIGS. 5 and 6, counts a number of pulses which pass through the wave shaping circuit 215, in accordance with an instruction from the service processor 231. The counting result obtained by the frequency counter 217 is returned to the service processor 231.

A description will now be given of a method for determining the delay time for which the variable delay circuit 221 in the unit 220 delays a signal.

A technique by which the propagation delay of an edge (e.g. the leading edge) of a single pulse taking a turn in a closed loop is calculated has been proposed in Japanese Laid Open Patent Application No. 4-157379. A total sum of delay times in respective parts of the closed loop correspond to the oscillating period obtained by supplying the single pulse to the closed loop. Thus, in this technique, the delay times of the respective parts of the closed loop are calculated based on the oscillating frequency in the closed loop to which the single pulse is supplied.

In the clock unit 210 shown in FIG. 14, when the selector 213 selects a feed-back signal from one of the units $220_1$–$220_n$, a function of the feed-back circuit 113 shown in FIGS. 5 and 6 is realized by a feed-back line from the selected unit 220 and the selector 213. A closed loop is formed between the clock unit 210 and the selected unit 220. Thus, the above technique can be applied to this closed loop. That is, the single pulse generating circuit 216 supplies a single pulse to the closed loop, and an oscillating frequency in the closed loop is measured by the frequency counter 217. As a result, an oscillating period corresponding to the oscillating frequency depending on the delay time in the variable delay circuit 221 included in the closed loop can be obtained.

As has been described above, the delay time in the variable delay circuit 221 is the total sum of delay time intervals for the respective taps, that is, the total sum of tap intervals. Thus, in order to determine the delay time in the variable delay circuit 221 of the unit 220 included in the above closed loop, while the respective taps of the variable delay circuit 221 are successively being selected, the deference between oscillating periods for a selected tap and a previously selected tap is then calculated by using the above technique.

In this case, the respective taps of the variable delay circuit 221 are successively selected by the service processor 231. Every time a tap is selected, the service processor 231 supplies to the single pulse generating circuit 216 and the frequency counter 217 an instruction for generating a single pulse and an instruction for starting a counting operation respectively. The service processor 231 then calculates an oscillating period based on the oscillating frequency obtained by the frequency counter 217 and calculates the difference between the oscillating periods for each adjacent taps as the tap interval. That is, a function of the delay calculation means 116 shown in FIG. 5 is realized.

A predetermined counting clock signal obtained by dividing of the clock signal from the crystal controlled oscillator 211 is, for example, supplied to the frequency counter 217. The frequency counter 217 then counts a number of pulses which pass through the wave shaping circuit 215 for one period of the counting clock signal.

As has been described above, the difference between delay times for each adjacent taps successively selected in the variable delay circuit 221 is determined, and the total sum of the tap intervals for taps extending to a selected tap is calculated. As a result, a delay time for which the input signal is delayed at the selected tap of the variable delay circuit 221 is determined. Hereinafter, the difference between delay times for the i-the tap and the (i–1)-the tap is referred to as a tap interval $T_i$.

Due to a switching operation of the selector 213, the closed loops corresponding to the units 220 can be formed. Thus, the service processor 231 controls the selector 213 so that the switching operation of the selector 213 is repeated, and the above process is performed in a closed loop obtained by every time the selector 213 performs the switching operation. As a result, the delay times in the variable delay circuit 221 for n units 220 are respectively determined.

That is, a function of the delay measurement means 111 shown in FIGS. 3, 4 and 5 is realized by the selector 213, the delay circuit 214, the wave shaping circuit 215, the single pulse generating circuit 216, the frequency counter 217 and the service processor 231.

The tap interval $T_i$ may be calculated based on an average value of the oscillating frequencies which are obtained by repeated measurements. In this case, the frequency counter 217 is repeatedly activated a plurality of times every time a tap of the variable delay circuit 221 is selected in accordance with the instruction from the service processor 231. A plurality of measurement results from the frequency counter 217 are thus obtained. The service processor 231 calculates the average value of the plurality of measurement results, and the average value is used to calculate the tap interval $T_i$.

The service processor 231 controls the frequency counter 217 in this manner, so that a function of the frequency measurement means 115 shown in FIG. 5. Due to this function, the measurement accuracy for the tap interval $T_1$ can be improved.

The service processor 231 provides to the delay time table 233 measurement values of the tap interval Ti for the respective units $220_1$–$220_n$ so that the measurement values correspond to the respective units $220_1$–$220_n$ in the delay time table 233.

After the delay times in the variable delay circuits 221 in all the units 220 are measured as has been described above, the service processor 231 selects a tap in the variable delay circuit 221 based on the measurement value of the tap interval $T_i$ in the delay time table 233. The above operations realizes a function of the setting means 112 shown in FIGS. 3 and 4, so that a determinable delay time can be set in the delay means 122 shown in FIGS. 3 and 4.

Thus, the reference phase generating circuit 222 can generate the reference phase signal having a determinable phase. The phase of the clock signal can be adjusted based on the reference phase signal.

The variable delay circuit 222 described above, as shown in FIG. 15, has 128 taps serially connected to each other, each taps being formed of two inverters. When a select signal is supplied to one of NOR gates connected to points at which the taps are connected, an output signal of a corresponding tap is selected. In FIG. 15, each tap corresponds to the delay element 141 shown in FIG. 7. Each tap makes a delay time of about 100 psec.($1 \times 10^{-2}$ seconds). The NOR gates connected to the respective taps and four converging circuits which are formed of NOR gates and NAND gates form a circuit corresponding to the selector 143 shown in FIG. 7.

The delay means 122 shown in FIGS. 3 and 4 can be realized as described above. In this case, since respective pairs of inverters are in the same operation state, the measurement accuracy of all the tap intervals $T_1$–$T_{127}$ can be improved. In a case where the variable delay circuit 221 is formed of CMOS elements, in order to measure a tap interval at a high accuracy, it is more important to make all the taps be in the same operation state.

In the reference phase generating circuit 222, as shown in FIG. 16, a trigger signal asynchronously supplied from the service processor 231 is synchronized with a clock signal supplied via the variable delay circuit 221 by three staged flip flops $241_1$–$241_3$ and an inverter 242. The output of a fourth staged flip flop $241_4$ is provided to a clock terminal of itself via an inverter 243 and an NAND gate 244. After states of the three staged flip flops $241_1$–$241_3$ are changed, the flip flop $241_4$ automatically stops an operation thereof. That is, the four staged flip flops $241_1$–$241_4$ form the flip flop 151 shown in FIG. 8 and the inverter 243 and the NAND gate 244 form the stopping means 152 shown in FIG. 8.

In FIG. 16, the output of the flip flop 2414 is distributed, as the reference phase signal, to the m LSIs $224_1$–$224_m$ via the inverter 243 and an output gate circuit 245.

As has been described above, the flip flop $241_4$ automatically stops the operation thereof in accordance with the changing of the output of itself, so that it is possible to prevent noises caused by bounce in a waveform. As a result, the reference phase signal having a fine waveform can be obtained, so that the accuracy in a correcting process for the delay time and the phase adjusting process can be improved.

Further, in the output gate circuit 245 shown in FIG. 16, the output of the inverter 243 is inverted by the inverter 246 and the output of the inverter 246 is supplied to m inverters $247_1$–$247_m$. Signals output from the inverters $247_1$–$247_m$ are supplied to coincidence detecting circuits 225 in the m LSIs 224 via the inverters $247_1$–$247_m$.

In the LSI 224 shown in FIG. 16, the reference phase signal supplied from a corresponding phase adjusting circuit 223 is supplied to the coincidence detecting circuit 225 via the clock distribution circuit 226 corresponding to the internal distribution network 176 shown in FIG. 12.

In the coincidence detecting circuit shown in FIG. 16, the reference phase signal is supplied to an input terminal D of the clock adjusting flip flop 252 corresponding to the flip flop 161 shown in FIG. 9. The output of the inverter 251 is delayed for a predetermined time by an inverter array 253 formed of seven inverters. The delayed signal is supplied, together with the clock signal, to an NAND gate 254 of the clock adjusting flip flop 252.

In the clock adjusting flip flop 252, the output of the NAND gate 254 is inverted by an inverter 255, and the inverted signal is then supplied, together with a signal from the input terminal D, to an NAND gate 256. Output terminals of two NAND gates 257a and 257b are mutually connected to input terminals thereof. Other input terminals of the NAND gates 257a and 257b are provided with the outputs of the NAND gates 256 nd 254.

As has been described above, the reference phase signal which is delayed by the inverter array 253 is supplied, as a clock enable signal, to the clock adjusting flip flop 252. Thus, the clock signal becomes a disenable state in accordance with the changing of the clock enable signal. That is, the inverter array 253 and the NAND gate 254 corresponds to the stopping means 162 shown in FIG. 9. The clock adjusting flip flop 252 can automatically stop the operation thereof at the trailing edge of the reference phase signal under a condition in which a logical state of the reference phase signal last input in synchronism with the clock signal is maintained. As a result, it is possible to prevent noises caused by the bounce in the waveform.

In the above case, only when the difference between the trailing edge of the clock signal and the trailing edge of the phase is smaller than the phase difference between the reference phase signal and the clock enable signal, the output of the clock adjusting flip flop 252 has a logical value of "1".

Thus, according to the construction shown in FIG. 16, it can be accurately determined, based on the output of the clock adjusting flip flop 252, whether or not the phases of the reference phase signal and the clock signal are coincident with each other. Therefore, monitoring the output of the clock adjusting flip flop 252, the changing of the output is detected, so that it can be accurately detected that the phases of the reference phase signal and the clock signal are coincident with each other.

Further, in this case, the outputs of the coincidence detecting circuit 225 of the respective LSIs 224 an be asynchronously monitored by the service processor 231. A function in which the phase adjusting circuit 223 is controlled in accordance with the output of a corresponding coincidence detecting circuit 225 corresponds to the adjusting control means 126 shown in FIG. 10.

Furthermore, a procedure in which it is determined whether or not a changing point of the output of the clock adjusting flip flop 252 is put between phase difference ranges in which a logical value of "0" is successively output from the clock adjusting flip flop 252 may be added to the adjustment processing program 232, each of the phase difference ranges having a width greater than a predetermined width. The changing point is detected as a point at which the phases of the reference phase signal and clock signal are coincident with each other.

In this case, a function of the service processor 231 corresponds to the detecting means 163 shown in FIG. 9. A narrow pulse having a width approximately equal to the predetermined delay time obtained by the inverter array 253 is ignored, so that a period of the clock signal can be accurately evaluated without influence of noises.

In FIG. 14, the delay circuit 214 corresponding to the delay means 131 shown in FIG. 5 is included in a loop corresponding to each unit 220. According to this structure, assuming that the delay time in the delay circuit 214 is, for example, $1 \times 10^{-6}$ seconds, a rate of the delay time to the oscillating period is not greater than about 1%. Thus, a difference between the oscillating frequencies obtained in the respective taps can be small.

As has been described above, the oscillating period is sufficiently longer than the delay time in the variable delay circuit 221, and difference between the oscillating frequencies obtained in the selected taps is small. As a result, the operating state variation caused by the selection of taps can be small. That is, all the tap intervals can be measured under almost the same condition, so that effect of the operating state variation on the measurement results of the oscillating period can be small. As a result, the measurement accuracy of the tap interval can be improved.

In a case where the variable delay circuit 221 is formed of CMOS elements, the variation of calorific value caused by the variation of oscillating frequency has great effect on the delay time. Thus, in this case, due to inhibiting the variation of the oscillating frequency, the measurement accuracy can be greatly improved.

However, in this case, a temperature-based correction must be applied to a measurement value of the tap interval $T_i$ for the following reason. The measurement process described above is performed under a condition in which the variable delay circuit 221 is operated in a frequency lower than that of an actual clock signal, that is, in a low temperature state. In general, it is known that the delay time in a low temperature state differs from that in a high temperature state.

A description will now be given of a method for correct the measurement value of the tap interval $T_i$ in accordance with the temperature.

Since the oscillating frequency of the crystal controlled oscillator 211 is constant, a period T of the clock signal generated based on the output of the crystal controlled oscillator 211 is constant. Thus, the variation of the tap interval caused by temperature may be evaluated based on the period T of the clock signal.

The clock signal is supplied to the variable delay circuit 221 so that the computer system is maintained in a high temperature state equivalent to the operating state. In this state, when the delay time corresponding to the period T of the clock signal is generated in the variable delay circuit 221, a measurement value D of the period of the clock signal may be obtained based on a number of a selected tap and the tap interval $T_i$. Since the measurement value D described above is calculated based on the tap interval $T_i$ in a low temperature state, a temperature coefficient $C_t$ indicating a rate of variation of the tap interval $T_i$ in temperature can be obtained as a rate of the measurement value D to the period T of the clock signal. Thus, the variation of the tap interval Ti in temperature is evaluated based on the temperature coefficient $C_t$, and the measurement value of the tap interval $T_i$ can be corrected.

In an actual process, after the service processor 231 switches the selector 213 so that the crystal controlled oscillator 211 is selected, the service processor 231 functions as the delay changing means 132 shown in FIG. 5. In the variable delay circuit 221, the respective taps are successively selected, so that the phase difference between the reference phase signal generated by the reference phase generating circuit 222 and the phase of the clock signal is varied.

At this time, the service processor 231 monitors the output of the coincidence detecting circuit 225 provided in one of the LSIs 224 and detects a group of taps selected in a case where the phases of the reference phase signal and the clock signal are coincident with each other, as a function of the detecting means 133 shown in FIG. 5.

Figure 17:
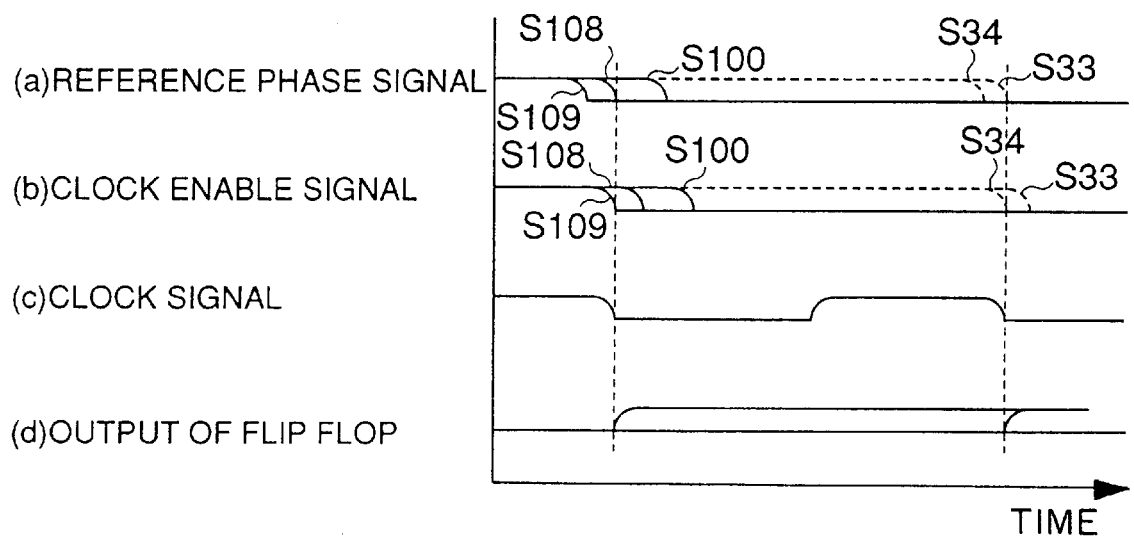
FIG. 17 is a timing chart illustrating operations of the coincidence detecting circuit.

FIG. 17 is a timing chart showing an operation of the coincidence detecting circuit.

In FIG. 17(a) and (c), trailing edges of the reference phase signal and the clock enable signal which are obtained when the i-the tap is selected are indicated by a symbol $S_i$, and FIG. 17(c) shows the clock signal.

Referring to FIG. 17(a), (b) and (c), when the 109-the and 108-the taps are selected, the phase difference between the reference phase signal and the clock signal falls within a range corresponding to the delay time obtained by the inverter array 253. In this case, as indicated by a thick solid line in FIG. 17(d), the output of the clock adjusting flip flop 252 is changed from the logical value of "0" to the logical value of "1" in synchronism with the trailing edge of the clock signal. Also, when the 34-the and 33-the taps are selected, the phases of the reference phase signal and the clock signal are approximately coincident with each other. Thus, the output of the clock adjusting flip flop 252 is changed, as shown by a dotted line in FIG. 17(d), in synchronism with the trailing edge of the clock signal. When another tap (e.g. the 100-the tap) is selected, the phases of the reference phase signal and the clock signal are not coincident with each other. Thus, in this case, the output of the clock adjusting flip flop 252 is maintained at the logical value of "0" without changing.

Therefore, according to the construction shown in FIG. 16, while the delay time applied to the reference phase signal is being changed by changing of the selected tap in the variable delay circuit 221, the output of the clock adjusting flip flop 252 is monitored. As a result, a tap for the coincidence of the phases of the reference phase signal and the clock signal can be accurately detected.

For example, the service processor 231 may detect, an appropriate tap, a tap selected when the output of the clock adjusting flip flop 252 is changed from the logical value of "0" to the logical value of "1". The function of the detecting means 133 shown in FIG. 5 is realized by the service processor 231. In a case shown in FIG. 17, the 109-the tap and the 34-the tap are detected as the appropriate tap.

Referring to FIG. 17, the phase difference between the phase of the reference phase signal in a case where the 109-the tap is selected and the phase of the reference phase signal in a case where the 34-the tap is selected corresponds to one period of the clock signal.

Thus, the service processor 231 calculates the total sum of tap intervals included between these taps, so that the measurement value D of the period of the clock signal can be obtained. The rate of the measurement value D to the period T of the clock signal (e.g. 8 nsec. in a case of the oscillating frequency of 125 MHz) is then calculated as the temperature coefficient $C_t$. The measured tap interval $T_i$ is multiplied by the temperature coefficient $C_t$ so as to be corrected. In this case, the correcting means 134 shown in FIG. 5 is realized by the service processor 231.

Accordingly, the measurement value of the delay time obtained in a low temperature state can be corrected so as to be changed to a value which will be obtained at a temperature in an actual operating state of the computer system. As a result, the delay time obtained in the variable delay circuit 221 can be accurately evaluated.

In addition, a procedure in which the measurement process for measuring the period of the clock signal is repeatedly carried out a plurality of times and a procedure in which the average of measurement values D obtained by the measurement process is calculated may be added to the adjustment processing program 232. In this case, the average of the measurement values D is corrected in accordance with a temperature. Accordingly, the service processor 231 has functions of the delay changing means 132, the detecting means 133 and the correcting means 134 shown in FIG. 5, so that effect of the noise is inhibited and the variation rate of the delay time in accordance with a temperature can be accurately evaluated. Thus, the delay time corresponding to a temperature can be accurately corrected.

The service processor 231 carries out the correcting process of the delay time based on the temperature for every unit 220, and the correcting result of the delay time in a corresponding variable delay circuit 221 is stored in the delay time table 233 instead of the measurement value.

Alternatively, in a case where the temperature coefficients $C_t$ for the respective units 220 are substantially equivalent to each other, the above temperature-based correction process for each unit 220 may be performed using a temperature coefficient $C_t$ obtained for one of the units 220.

A description will now be given of a method for adjusting the phase of the clock signal distributed to the respective units 220 using the delay times obtained by the variable delay circuit 221 as has been described above.

The computer system shown in FIG. 14 includes the constitution shown in FIG. 6. The clock adjusting means 124 shown in FIG. 6 is realized by m phase adjusting circuits $223_1$–$223_m$ corresponding to the delay means 135 and n phase adjusting circuits $212_1$–$212_n$ corresponding to the delay means 136.

The service processor 231 controls the n phase adjusting circuits 212 in accordance with the adjustment processing program 232 so that the phase adjustment for the n units 220 is performed.

That is, the service processor 231, first, operates as the delay setting means 137 shown in FIG. 6 so as to select the same tap of the variable delay circuits 221 in the respective units 220. At this time, the service processor 231 may select the 64-the tap located at the center in a variable range of the delay time set in the variable delay circuit 221. The service processor 231 then controls the selector 213 of the clock unit 210 so that a closed loop including one of the n units 220 is formed.

The service processor 231 then activates the single pulse generating circuit 216 and the frequency counter 217. The service processor 231 monitors the oscillating frequency obtained by the frequency counter 217 and controls the phase adjusting circuit 212 included in the closed loop described above. At this time, the service processor 231 may controls the phase adjusting circuit 212 so that the oscillating frequency becomes equal to a predetermined frequency $F_s$.

The phase adjusting circuit 212 is, as shown in FIG. 13, formed of an inverter, a variable delay circuit and another inverter all of which are serially connected to each other. The variable delay circuit of the phase adjusting circuit 212 has the same structure as the variable delay circuit 221 shown in FIG. 15.

Thus, the service processor 231 successively selects taps provided in the variable delay circuit in the phase adjusting circuit 212 to be controlled, and detects a tap by which the oscillating frequency changed in accordance with the selection of taps is coincidence to the predetermined frequency $F_s$. The phase adjusting circuit 212 is fixed in a state using the selected tap. As a result, the delay adjusting means 138 shown in FIG. 6 is realized by the service processor 231.

The oscillating frequencies in closed loops corresponding to all the units 220 are adjusted so as to be coincident with the predetermined frequency $F_s$ in the same manner as described above. Thus, the phase difference between clock signals distributed from the clock unit 210 to the units 220 can be adjusted. As a result, the clock signals having the same phase can be distributed from the clock unit 210 to the n units 220.

The value of the frequency $F_s$ described above is previously decided based on design values of wiring length between the clock unit 210 and the respective units 220. The value of the frequency $F_s$ may be built in the adjustment processing program 232 as internal data.

The service processor 231 then selects and fixes, in accordance with the phase difference to be set for each unit 220, a suitable tap in a corresponding variable delay circuit 221. A phase adjusting operation in each unit 220 is started.

The service processor 231 sets the tap (e.g. the 64-the tap) selected in the phase adjusting operation for the units as a reference position, and selects a tap for a unit so that the phase difference to be set for the unit is generated based on the interval between the selected tap and the reference position. For example, in a case where a clock in which the phase is delayed by 2 nano-seconds is supplied to a unit $220_1$, tap intervals are added starting from the tap interval $T_{63}$ corresponding to the 64-the tap in an increasing order until the adding result reaches a value nearest to 2 nano-seconds. When the adding result reaches the value nearest to 2 nano-seconds, a tap (e.g. the 83-the tap) corresponding to a last added tap interval is detected. A selecting signal corresponding to the detected tap is then supplied to the variable delay circuit 221.

The phase difference to be set for each unit 220 is previously decided based on characteristics of each unit 220, and is built in the adjustment processing program 232 in the same manner as the frequency Fs.

In a state where it is guaranteed that the clocks having the same phase are supplied to the respective units 220 as has been describe above, a delay corresponding to the phase difference specified by the variable delay circuit 221 corresponding to each unit 220 is generated. In this case, a function of the delay setting means 137 shown in FIG. 6 is realized by the service processor 231.

Accordingly, the reference phase generating circuit 222 corresponding to each unit 220 can accurately generate the phase reference signal having a corresponding phase difference, so that the adjusting operation will be described later can be accurately carried out.

In a case where the variation of characteristics of the variable delay circuits 221 in the respective units 220 is small enough, in each variable delay circuit 221, a tap away from the reference position by an interval corresponding to the phase difference to be set for a corresponding unit 220 may be selected. In this case, the oscillating frequency in the loop including each unit 220 is controlled at the frequency $F_s$, so that the clock signal in which the phase is varied by the phase difference to be set for each unit 220 can be supplied to a corresponding unit 220.

After the phases for the respective units 220 are adjusted as has been described above, the service processor 231 selects one of the LSIs 224 in a unit 220 to be adjusted. The service processor 231 then monitors the output of the coincidence detecting circuit 225 in the selected LSI 224 and controls the phase adjusting circuit 223 corresponding to the selected LSI 224. The phase of the clock signal is matched to that of the reference phase signal described above.

The phase adjusting circuit 223 is formed, in the same manner as the phase adjusting circuit 212 described above, of two inverters and a variable delay circuit which are serially connected to each other. The variable delay circuit has the same structure as the variable delay circuit 221 shown in FIG. 15.

Thus, the service processor 231 selects taps in the variable delay circuits in the phase adjusting circuits 223 so as to realize a function of the phase changing means 164 shown in FIG. 10. The phase difference between the clock signal supplied to a unit 220 and the reference phase signal can be changed. In addition, every time a tap is selected in the phase adjusting circuit 223, the service processor 231 supplies a trigger signal to the reference phase generating circuit 222 in the unit 220. A tap corresponding to a point at which the output of the coincidence detecting circuit 225 is changed from the logical value of "0" to the logical value of "1" is detected. This operation realizes a function of the detecting means 165 shown in FIG. 10. Thus, a delay time which is to be generated in the phase adjusting circuit 223 to match the phase of the clock signal to the phase of the reference phase signal can be detected. The phase adjusting circuit 223 is fixed at the detected tap, so that a function of the adjusting instruction generating means 166 shown in FIG. 10 can be realized.

Taps in the variable delay circuit in the phase adjusting circuit 223 are successively selected, for example, in an increasing order starting from a tap corresponding to the smallest delay time. When the output of the clock adjusting flip flop 252 of the coincidence detecting circuit 225 has the logical value of "0", the service processor 231 determines that the phases of the clock signal and the reference phase signal are not coincident with each other, so as to select the next tap. On the other hand, when the output of the clock adjusting flip flop 252 has the logical value of "1", the service processor 231 determines that the phases of the clock signal and the reference phase signal are coincident with each other and the variable delay circuit in the phase adjusting circuit 223 is fixed at the selected tap. As a result, the phase of the clock signal supplied to the LSI 224 via the phase adjusting circuit 223 is matched to the phase of the reference phase signal.

Even if delay times for the respective units 220 are different from each other, the phase of each of the clock signals distributed to all the LSIs 224 can be matched to the phase of the reference phase signal. Thus, clock signals in which the phases thereof are varied by a predetermined difference can be accurately distributed to all the LSIs 224 in the respective units 220.

Further, in the output gate circuit 245 shown in FIG. 16, the output terminals of the m inverters 247 corresponding to the respective LSIs 224 are shortened, and reference signal output terminals for these inverters 247 are coupled to the respective LSIs 224 by wiring lines having the same length. As a result, the structure shown in FIG. 11 is realized. In FIG. 16, the m inverters 247 correspond to the buffer elements 174 shown in FIG. 11, and wiring lines connecting the m reference signal output terminals to the reference phase input terminals of the respective LSIs 224 are correspond to the reference phase distribution network 172. According to the above structure, the phase difference among the reference phase signals distributed to the respective LSIs 224 can be reduced, so that the phase adjusting accuracy for the clock signal supplied to each LSI can be improved.

The wiring lines connecting the m reference signal output terminals and the m LSIs 224 may be shortened at the center of the unit and be distributed from the shortened point to the respective LSIs 224, instead of shortening the output terminals of the inverters 247 in the output gate circuit 245. Also, in this case, the phase difference among the reference phase signals distributed to the LSIs 224 can be reduced.

Meanwhile, in the output gate circuit 245, an inverter element having an allowable current great as m times as each inverter 247 may be used, as a buffer element 175, instead of the m inverters 247. In this case, the reference phase signals are distributed from a signal reference output terminal connected to the inverter element to the respective LSIs 224.

According to this structure, the phase reference signals can be collectively supplied to a plurality of LSIs 224. In a case where a single buffer having an allowable current large enough can not be obtained, the allowable current may be allotted to a number of buffer elements, which number is in a range of 2–(m–1).

In a case, as has been described above, where the m phase adjusting circuits 223 corresponding to the m LSIs 224 are provided in each unit, the phase of the clock signal is adjustable for each LSI 224. Thus, the phase of a clock signal supplied to a LSI can be different from the phase of a clock signal supplied to another LSI 224. In a case, for example, where the phase of a clock signal supplied to LSIs $224_j$–$224_k$ is delayed by 1 nano-second from the phase of a clock signal supplied to other LSIs, the phase adjusting circuits $223_j$–$223_k$ corresponding to the LSIs $224_j$–$224_k$ are adjusted under a condition in which a tap corresponding to the delay is selected in the variable delay circuit 221.

Since the phase of the clock signal can be adjusted for each LSI as has been described above, phases of clock signals for the units having various characteristics can be finely adjusted.

The clock distribution circuit 226 for distributing clock signals from a clock terminal of the LSI 224 to general flip flops is formed as shown in FIG. 18.

Referring to FIG. 18, first, a clock signal is received by a gate in a center portion of the LSI and the clock signal is distributed to gates in center portions of ¼ regions. The clock signal are branched into clock signals from the center portion of each ¼ region. The clock signals are distributed to center portions of 1/16 regions. The clock signal are branched, from the center portion of each 1/16 region, into clock signals, and the lock signals are further distributed to a plurality of final buffers. The final buffers drive the respective general flip flops. In FIG. 16 and 18, inverters are used as the gates in the clock distribution circuit 226 and the final buffers.

Thus, the coincidence detecting circuit 225 is provided in the center portion of each LSI 224, the clock signal is supplied to the coincidence detecting circuit via one of the final buffers. As a result, the coincidence detecting circuit 225 can be operated under the same condition as the general flip flop, so that phase of the clock signal can be more finely adjusted.

Further, in a case where the LSI 224 is provided with a plurality of clock terminals and clock distribution circuits 226 corresponding to the respective clock terminals distribute clock signals to different regions in the LSI 224, phase adjusting circuits 223 and coincidence detecting circuits 225 may be provided so as to correspond to the respective clock terminals. In this case, the same reference phase signal is supplied to the coincidence detecting circuits 225, and the phase of the clocks signal is adjusted for each clock terminal.

Figure 19:
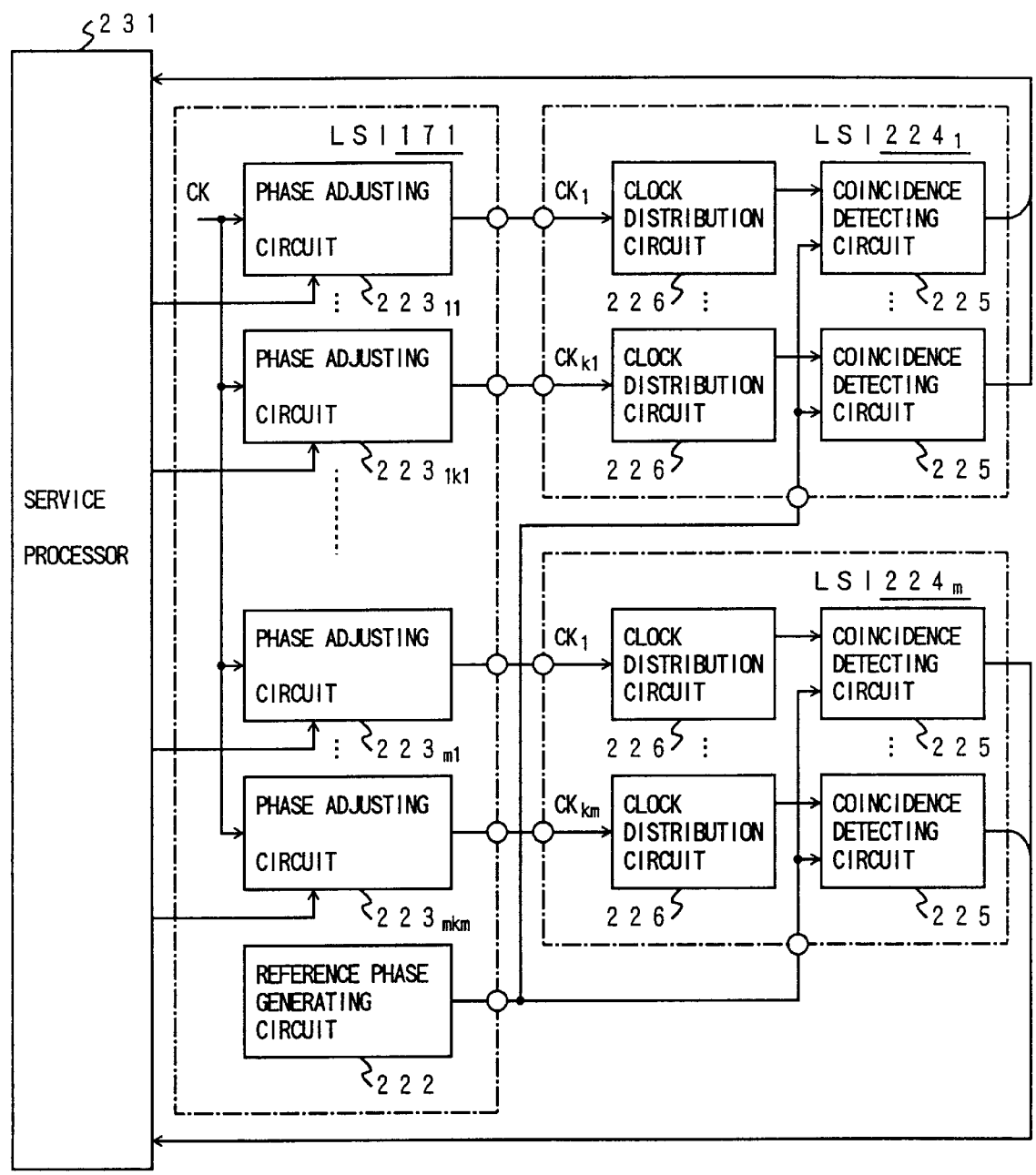
FIG. 19 is a block diagram illustrating an embodiment of the clock signal adjusting apparatus as claimed in claim 22.

For example, as shown in FIG. 19, in a case where the i-the LSI $224_i$ is provided with $k_i$ clock terminals $Ck_1-Ck_{ki}$, the i-the LSI $224_i$ is provided with $k_i$ coincidence detecting circuits 225 and the unit 220 has $k_i$ phase adjusting circuits $223_{i1}-223_{iki}$ corresponding to the i-the LSI $224_i$.

Figure 20:
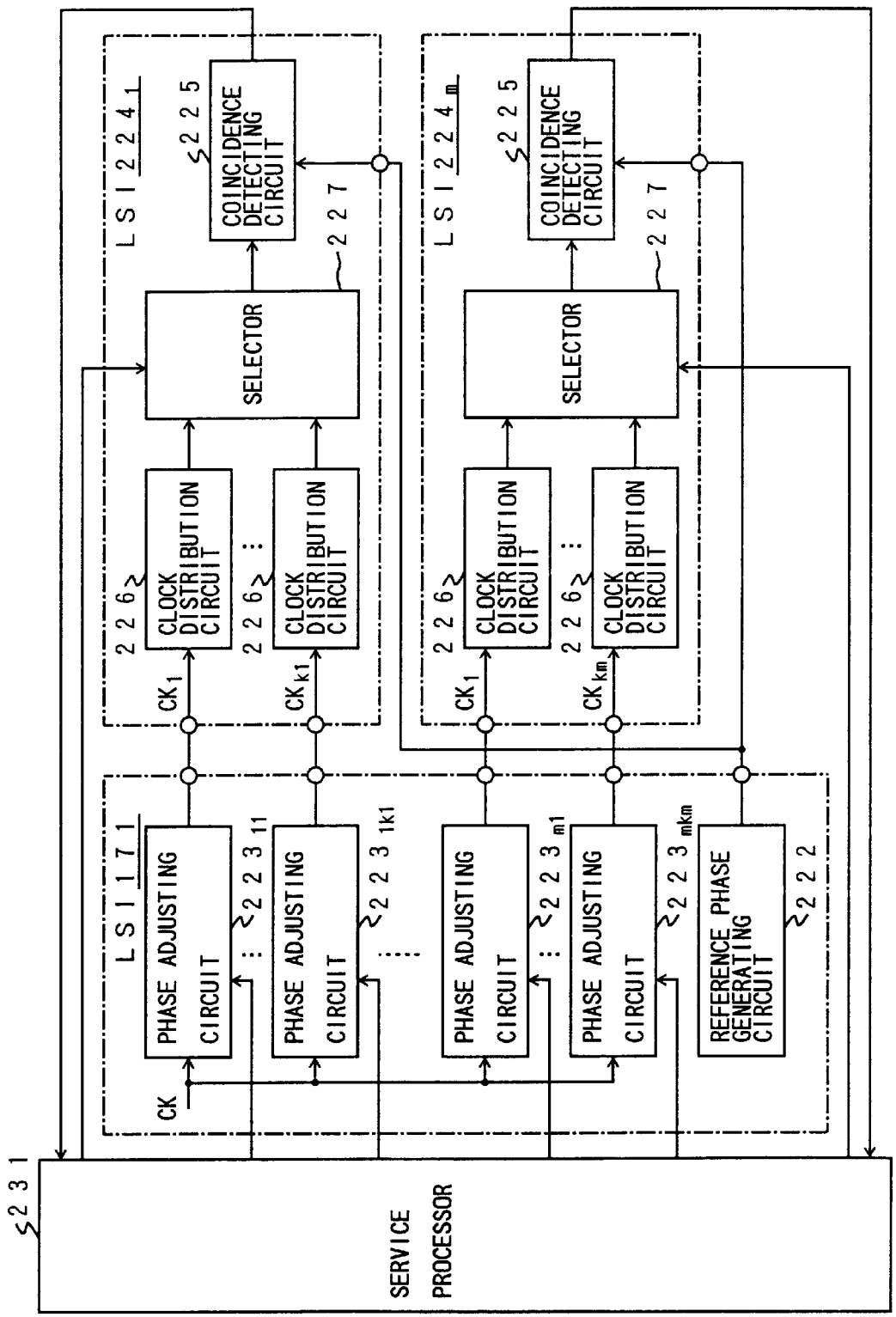
FIG. 20 is a block diagram illustrating another embodiment of the clock signal adjusting apparatus as claimed in claim 22.

Further, as shown in FIG. 20, clock signal selected from among $k_i$ clock signals by a selector 227 may be supplied to a signal coincidence detecting circuit 225, instead of providing $k_i$ coincidence detecting circuits 225 corresponding to the $k_i$ clock terminals. While selector 227 is switching a selected clock signal, the phase adjusting operations are successively carried out.

A plurality of selectors 227 may be used. In this case, the clock signals from $k_i$ clock terminals are supplied to a number (within a range of $2-k_i$) of coincidence detecting circuits via the selectors 227.

In a case where the LSI 224 is provided with a plurality of clock terminals, the clock distribution network 173 is generally used as wiring lines connected to the clock terminals, the wiring lines having the same length. Thus, reasons for generating a phase difference between clock signals supplied to the clock terminals are reduced. In this case, the phase adjusting circuits 223 corresponding to the respective clock terminals are controlled, so that the phases of the clock signals supplied to a plurality of clock terminals can be coincident with each other based on the same reference phase signal.

As has been described above, in accordance with various characteristics of the units and the LSIs in the units, the phases of the clock signals can be accurately adjusted.

In the present invention, the resolution in the phase control operation depends on the resolution in taps in the variable delay circuit 221 forming the delay means 122 and the clock adjusting means 124. However, in the above embodiment, the tap interval which is about 100 pico-seconds is sufficiently smaller than the period (8 nano-seconds) of the clock signal.

Further, a fine adjusting circuit 228 as shown in FIG. 21 may be provided in the system. Referring to FIG. 21, the fine adjusting circuit 228 selectively outputs, by use of a selector 249, an signal from a circuit including a wiring load 248 making a delay time of 50 pico-seconds or a signal from a circuit having a small load. The output of the fine adjusting circuit 228 is supplied to the variable delay circuit 221, so that resolution can be improved.

In addition, in FIG. 16, the reference phase generating circuit 222 receives the trigger signal, which is changeable from the logical value of "0" to the logical value of "1", from the service processor 231. As a result, the reference phase signal which is changed from the logical level of "1" to the logical level of "0" is obtained in synchronism with the trailing edges of the clock signal supplied from the variable delay circuit 221. That is, in the output gate circuit 245, the signal supplied to the output gate circuit 245 is inverted by the inverter 246, and the inverted signal is further inverted by the inverters $247_1-247_m$ corresponding to the respective LSIs 224. The outputs of the inverters $247_1-247_m$ are then provided to the LSIs 224. Thus, the reference phase generating means 123 shown in FIGS. 3 and 4 is realized.

The coincidence detecting circuit 225 detects the coincidence between the phases based on the trailing edges of the clock signal. The phase of front edges falling down are adjusted.

In this case, in the output gate circuit 245 as shown in FIG. 16, the signal is inverted by the inverter 246, the inverted signal is further inverted by the inverters 2471–247m serially, and the outputs from the inverters 2471–247m are supplied as the reference phase signals to the respective LSIs 224, so that the reference phase generating means 123 can be realized. The changing direction of the reference phase signal can be adjusted at the front falling edge of the clock signal. Thus, the influence of variations of signals and threshold levels depending on temperature variation and power variation can be reduced on the detecting operation in the coincidence detecting circuit 225.

Thus, due to adjusting clock signals, the phasing accuracy of clock signals which accuracy required in high performance computer systems can be obtained.

The clock adjusting operation can be carried out under a condition in which the clock signals are continuously supplied to the system, so that a time required for the phase adjusting operation can be reduced.

In addition, in a case where clock signals having the same phase are distributed to the LSIs 224 in each unit 220, the same reference phase signal can be used for all the LSIs 224. Thus, the phase adjusting operations for all the LSIs 224 can be carried out in parallel. The LSIs 224 may be grouped into groups each having m LSIs 224, and clock signals having the same phase may be distributed to the m LSIs 224 in each group. In this case, the phase adjusting operations for the m LSIs 224 in each group are carried out in parallel. A time required for the phase adjusting operation for the clock signals can be reduced.

A state where the clock signals are continuously supplied to the system means a state in which the system is activated, and realizes a thermal equilibrium state. The phase adjusting accuracy for the clock signals is not reduced by variations of operating characteristics depending on the temperature variation of the LSIs included in each unit. Since CMOS elements have disadvantages regarding the variation of operating characteristics based on temperature variation, the present invention is effective in high performance computers using the CMOS elements.

Each of the variable delay circuit 221, the reference phase generating circuit 222 and the phase adjusting circuit 223 can be formed a number of gates which number falls within a range between several tens and several hundreds. Recently, in a LSI, more than several hundreds of thousands gates can be integrated. Thus, the above circuits can be integrated in a single LSI. In addition, also since each of the selector 213, the delay circuit 214, the wave shaping circuit 215, the single pulse generating circuit 216 and the frequency counter 217 can be formed several hundreds gates, these circuits can be integrated in a signal LSI. Further, since the coincidence circuit 225 is formed of a few gates (several tens gates), the coincidence circuit 225 and general flip flops can be integrated in a signal LSI.

The clock phase adjusting unit, according to the present invention, in which the respective functions are integrated in LSIs or the respective functions and other circuits are integrated in LSIs as described above can be mounted in the high performance computer. Thus, the phase adjusting operation for the clock signals can be carried out in a finished system without other external units.

In addition, since the units can be driven using the clock signal having appropriate phases due to the phase adjusting operation for the clock signals, the computer can be operated in the highest performance using high speed clock signals.

In addition, the phase difference between the clocks signals is accurately estimated, and the clock signals are accurately adjusted. As a result, the performance of the computer operated using high speed clocks can be strictly established. Thus, the present invention is useful for development of high performance computers.

Before the computer is activated, the service processor 231 executes the adjustment processing program 232 in accordance with an operator, so that the clock adjusting operation is carried out.

The phase difference between clock signals is generated caused by the difference between lengths of wire lines in and between units, the temperature difference and the power difference. If these conditions are constant, the phase adjusting operation for the clock signals is not needed to be carried out every time the computer is activated.

Thus, for example, when the computer system is installed, the phase adjusting operation is carried out by the service processor 231. The results obtained by the phase adjusting circuit 212 in the clock unit 210 and the results obtained by the phase adjusting circuits 223 in the respective units may be stored in the service processor 231. After this, the phase adjusting circuits 212 and 223 are controlled using the results stored in the service processor 231.

Figure 22:
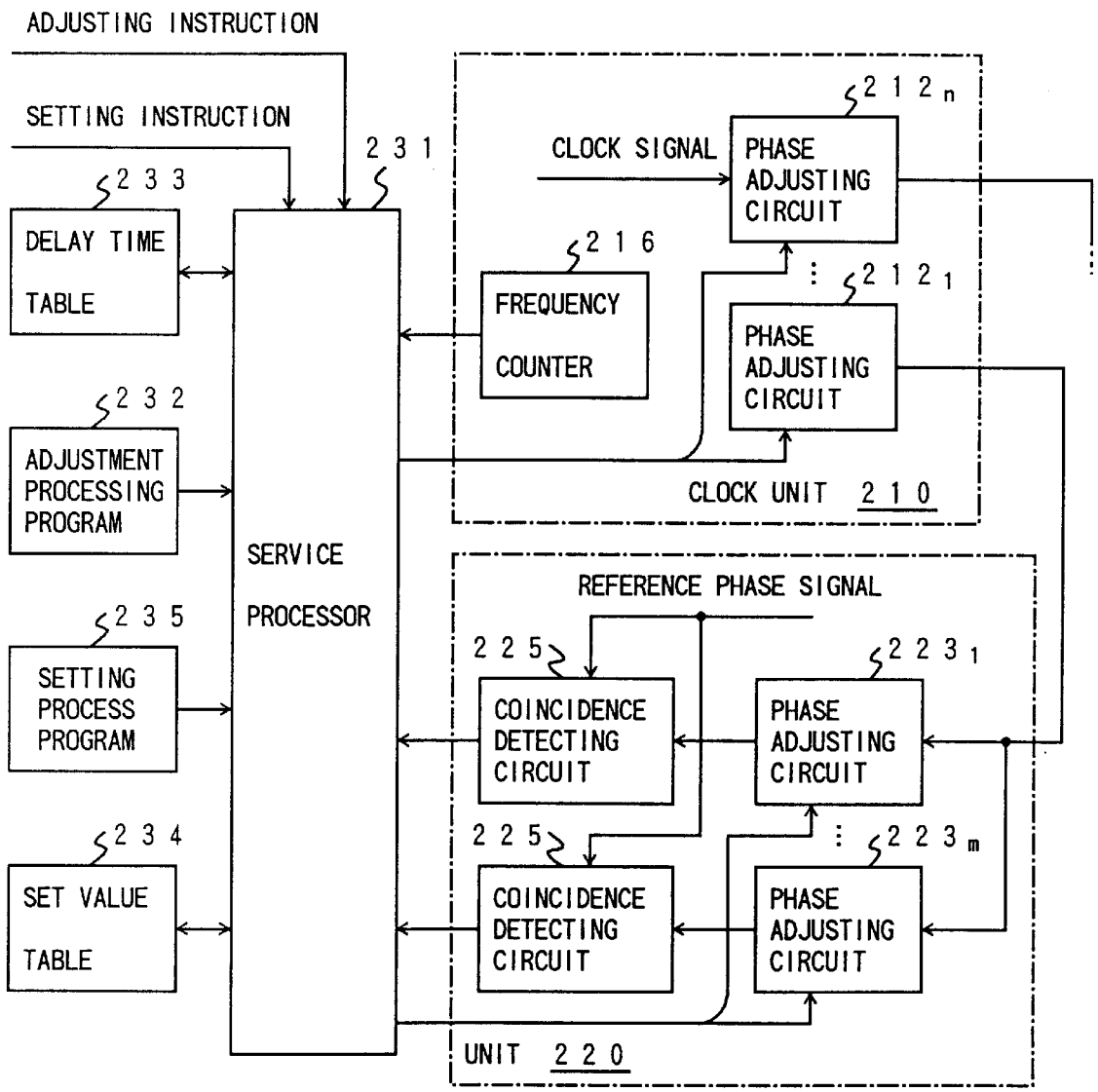
FIG. 22 is a block diagram illustrating an embodiment of the clock signal adjusting apparatus as claimed in claim 23.

A set value table 234 and a setting operation program 235 may be added, as shown in FIG. 22, to the clock signal adjusting unit shown in FIG. 14. The service processor 231 executes the adjustment processing program 232 in accordance with adjusting instructions supplied thereto and executes the setting operation program 235 in accordance with setting instructions supplied thereto. In this case, a step for setting in the set value table 234 information representing a tap last set in each phase adjusting circuit 212 and each phase adjusting circuit 223 is added to the adjustment processing program 232.

Due to adding the step, the service processor 231 and the set value table 234 realize the setting information storage means 181 shown in FIG. 13.

The setting operation program 235 has a sep for reading out from the set value table 234 the information corresponding to each phase adjusting circuit 212 and each phase adjusting circuit 223 and a step for setting the information in corresponding phase adjusting circuits 212 and 223.

Functions of the reading means 182 and the adjusting control means 126 shown in FIG. 13 are realized by the service processor 231 operated in accordance with the setting operation program 235.

Further, in a temperature constant oven, the adjusting operations for the clock signals are carried under various conditions, and adjusting results obtained under the various conditions are stored in a memory of the service processor 231. After the computer system is installed, the phase adjusting circuits 212 and 223 are controlled using the adjusting results corresponding to the environment of the computer system which results are read out from the memory of the service processor 231.

Figure 23:
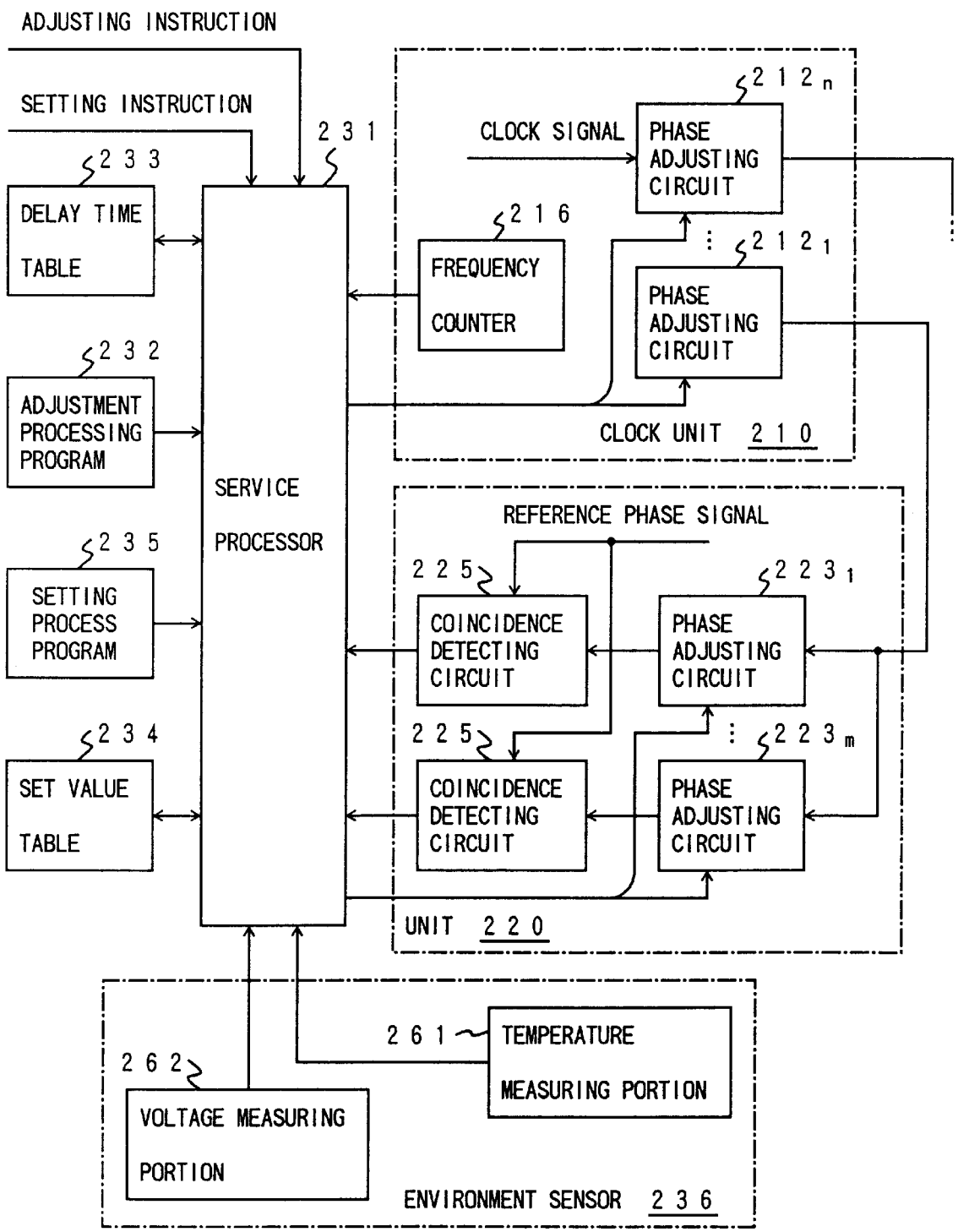
FIG. 23 is a block diagram illustrating an embodiment of the clock signal adjusting apparatus as claimed in claim 24.

FIG. 23 shows another embodiment of the clock is signal adjusting unit applied to the computer system.

Referring to FIG. 23, the clock signal adjusting unit has a constitution in which an environment sensor 236 corresponding to the sensing means 183 shown in FIG. 13 is added to the constitution of the clock signal adjusting unit shown in FIG. 22. In this clock signal adjusting unit, when the service processor 231 operates in accordance with the adjustment operating program 232 and the setting operation program 235, the operation is carried out with reference to the output of the environment sensor 236.

Further, in FIG. 23, the environment sensor 236 has a temperature measuring portion 261 and a voltage measuring portion 262. Results obtained by the temperature measuring portion 261 and the voltage measuring portion 262 are supplied to he service processor 231.

In this case, a first step and a second step are added to the adjustment processing program 232 instead of the step for storing the set value described above. In the first step, the temperature and the voltage is supplied from the environment sensor 236. In the second step, setting information, corresponding to the environment information including the temperature and the voltage, for each phase adjusting circuit 212 and each phase adjusting circuit 223 is stored in the set vale table 234.

Thus, the setting information storage means 181 shown in FIG. 13 can be realized by the service processor 231 operated in accordance with the adjustment operating program 232 and the set value table.

For example, the power voltage is maintained at a constant level, and the adjusting operation for the clock signals are carried out in a constant temperature oven under environment conditions: at a low temperature (e.g. 0° C.); at a room temperature (e.g. 20° C.) and at a high temperature (e.g. 30° C.). Setting information items corresponding to the respective environment conditions (the respective temperatures) are obtained. The setting information items are stored in the set vale table 234. Further, at each temperature, the phase adjusting operation for the clock signals is carried out under conditions: at a normal power voltage; at a power voltage lower than the normal power voltage and at a power voltage higher than the normal power voltage. As a result, setting information items (set values) corresponding to the environment condition represented by the combination of the temperature and the power voltage are stored in the set value table 234.

A step for receiving a temperature and a voltage from the environment sensor 236 and a step for searching the set value table 234 for setting information items corresponding to the received temperature and the voltage may be added to the setting operation program 235. In this case, a function of the reading means 182 shown in FIG. 13 can be realized.

In the above step for searching for the setting information items, with reference to the setting information storage portion 234 in accordance with information from the environment sensor 261, a setting information item closest to the information supplied from environment sensor 261 may be selected.

Accordingly, suitable values can be set in each phase adjusting circuit 212 and each phase adjusting circuit 223 based on the setting information items corresponding to the environment in which the computer system is installed.

Figure 24:
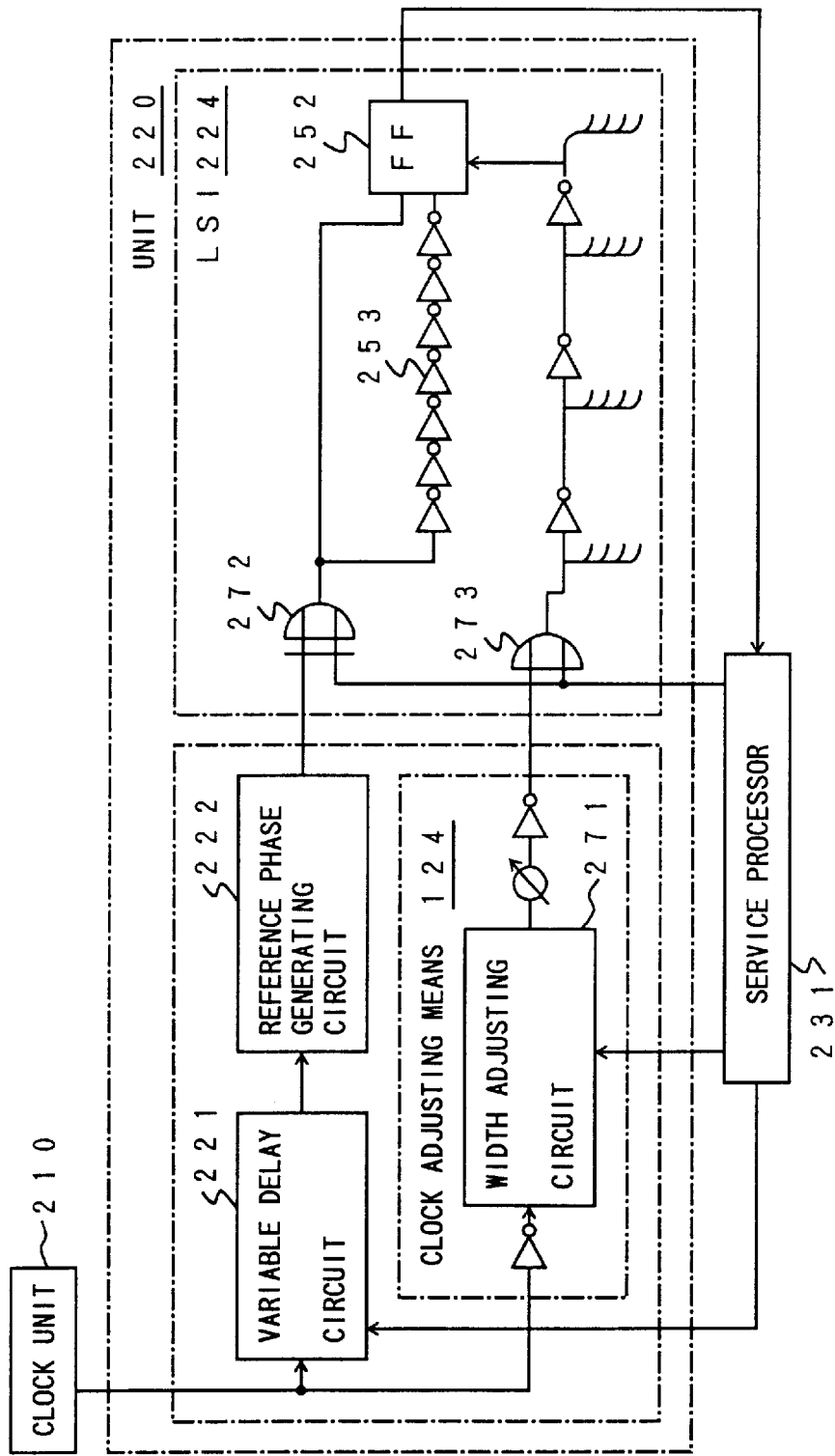
FIG. 24 is a block diagram illustrating an embodiment of the clock signal adjusting apparatus as claimed in claim 5.

In addition, a pulse width of each clock signal can be adjusted by using the functions used in the phase adjusting operation for the clock signals. FIG. 24 shows an essential part of a clock signal adjusting unit according to another embodiment of the present invention.

Referring to FIG. 24, the clock adjusting means 124 has a constitution in which a width adjusting circuit 271 corresponding to the pulse width adjusting means 127 shown in FIG. 4 is added to each phase adjusting circuit 223. In each LSI 224, an ExOR (Exclusive OR) gate 272 and 273 are substituted for the first inverter of the clock distribution circuit 226 and the inverter 251 of the coincidence detecting circuit 225. An edge of the signal which edge is to be notice in the operation is inverted in accordance with an inverting control signal.

In this case, the service processor 231 carries out the phase adjusting operation for the clock signal under a condition in which the phase inverting signal having the logical value of "0" is supplied to the service processor 231. After this, the inverting control signal having the logical value of "1" is input to the service processor 231. As a result, the edge of the signal which edge is used by the clock adjusting flip flop 252 to determine the phase relationship is changed from a falling edge to a rising edge. That is, the service processor 231 controls the ExOR gates 272 and 273 in accordance with the inverting control signal, so that a function of the inverting means 128 shown in FIG. 4.

Thus, the service processor 231 controls the width adjusting circuit 271 with monitoring the output of the clock adjusting flip flop 252 in the same manner as in a case of the phase adjusting operation. As a result, the rising edge of the clock signal can be adjusted to the edge of the reference phase signal. Accordingly, a function of the width adjusting control means 129 shown in FIG. 4 can be realized by the service processor 231, so that the width of the clock signal can be adjusted to a desired value.

Therefore, since the phase and width of the clock signal can be adjusted, the clock signal can be further accurately adjusted.

The present invention is not limited to the aforementioned embodiments, and variations and modifications may be made without departing from the scope of the claimed invention.

What is claimed is:

1. A clock signal adjusting method applicable to an information processing system in which clock signals are distributed from a clock generating unit to a plurality of load units, each of the plurality of load units having at least a load element operated in synchronism with a clock signal input to each of said load units, said clock signal adjusting method comprising steps of:
   (a) measuring delay times set in each of a plurality of delay means in accordance with setting instructions, said plurality of delay means being provided so as to correspond to said load units, each of said plurality of delay means delaying an input signal by a delay time set therein;
   (b) inputting, based on measuring results obtained in said step (a), to said plurality of delay means setting instructions corresponding to delay times to be set in said plurality of delay means;
   (c) generating reference phase signals having predetermined phase differences based on outputs of said plurality of delay means; and
   (d) adjusting, based on phases of said reference phase signals generated in said step (c), a phase of the clock signal distributed for said load element in each of said load units.

2. The clock signal adjusting method as claimed in claim 1, wherein said step (a) has steps of:
   (a-1) forming a loop including each of said plurality of delay means corresponding to said load units; and
   (a-2) measuring the delay time in each of said plurality of delay means corresponding to said load units, based on an oscillating frequency obtained when a single pulse is supplied to the loop obtained in said step (a-1).

3. The clock signal adjusting method as claimed in claim 2, wherein the loop further includes another delay means generating a delay time which is greater than the delay time generated by each of said delay means corresponding to said load units, said method further comprising steps of:
   (e) detecting at least two delay times by which the phase of the reference phase signal and the phase of the clock signal are coincident with each other while the delay time in each of said plurality of delay means is being changed; and
   (f) correcting a measurement value of the delay time in each of said plurality of delay means, based on a difference between the delay times detected in said step (e) and the frequency of the clock signal.

4. A clock signal adjusting apparatus applicable to an information processing system in which clock signals are distributed from a clock generating unit to a plurality of load units, each of said plurality of load units having at least a corresponding load element driven based on a clock signal input to each of said plurality of load units, said clock signal adjusting apparatus comprising:
   a plurality of first delay means, provided so as to correspond to said load units, for delaying input signals by delay times corresponding to setting instructions supplied thereto;
   delay measuring means for measuring delay times corresponding to setting instructions for each of said plurality of first delay means;
   setting means for generating, based on measuring results obtained by said delay measuring means, setting instructions in accordance with phase adjusting instructions supplied thereto, the setting instructions corresponding to delay times to be set in said plurality of first delay means, and for supplying the setting instructions to the corresponding plurality of first delay means;
   reference phase generating means for generating, based on the clock signals supplied thereto via the corresponding plurality of first delay means, reference phase signals having phase differences corresponding to the delay times set in said plurality of first delay means;
   clock adjusting means for receiving the clock signals which are to be distributed to said load units and for delaying the clock signals by delay times corresponding to adjusting instructions so as to adjust the phases of the clock signals, each adjusted clock signal being supplied, as an internal clock signal, to the load element in a corresponding one of said load units;
   coincidence determining means, provided for each of said respective load units, for determining whether a phase of the reference phase signal and a phase of the internal clock signal in each of said load units are coincident; and
   adjusting control means for generating the adjusting instruction in accordance with a coincidence determination by said coincidence determining means and for supplying the adjusting instruction to said clock adjusting means.

5. The clock signal adjusting apparatus as claimed in claim 4, wherein said setting means further generates, based on the measurement results, setting instructions corresponding to specified widths in accordance with width adjusting instructions and supplied the setting instructions to the plurality of corresponding first delay means, wherein said clock adjusting means comprises pulse width adjusting means, operated in accordance with the width adjusting instructions, for changing pulse widths of the internal clock pulses in accordance with width changing instructions and for outputting the internal clock pulses having the changed pulse widths, wherein said coincidence determining means has inverting means for inverting a logical relationship between the phase reference signal and the internal clock signal based on the width adjusting instruction, said coincidence determining means determining whether or not phases of the reference phase signal and the internal clock signal, which are inverted by said inverting means, are coincident with each other, and wherein said adjusting control means has width adjusting control means, operated in accordance with the width adjusting instructions, for generating the width changing instructions in accordance with coincidence determination results obtained by said coincidence determining means and for supplying the width changing instruction to said pulse width adjusting means.

6. The clock signal adjusting apparatus as claimed in claim 4, wherein said delay measuring means comprises:
feedback circuits forming loops including the first delay means corresponding to said load units;
single pulse generating means for supplying single pulses to the loops formed by said feedback circuits;
frequency measuring means for measuring oscillating frequencies caused by the single pulses in the respective loops; and
delay calculating means for calculating the delay times in the first delay means included in said respective loops.

7. The clock signal adjusting apparatus as claimed in claim 6, wherein said frequency measuring means measures, a plurality of times, each of the oscillating frequencies, an average of a plurality of measured oscillating frequencies being supplied, as the measurement result, to said delay calculating means.

8. The clock signal adjusting apparatus as claimed in claim 6, wherein each of said feedback circuits further has second delay means for providing a delay time greater than each of the delay times in said plurality of first delay means, and wherein said delay calculating means comprises:
delay changing means for changing each of the delay times provided by said plurality of first delay means within a range corresponding to at least one period of the clock signal;
detecting means, receiving from said delay changing means information regarding delay times in said first delay means, for detecting a plurality of delay times set in said first delay means when the phases of the clock signals and the reference phase signals are coincident with each other, based on the coincidence determination results of said coincidence determining means corresponding said load units; and
correction means for correcting the measurement result of the delay time calculated from the frequency obtained by said frequency measuring means, based on differences among the plurality of delay times obtained by said detecting means and the periods of the clock signals.

9. The clock signal adjusting apparatus as claimed in claim 8, wherein said delay changing means repeatedly execute a changing operation for the delay time in each of said plurality of first delay means, wherein said detecting means detects a number of sets of delay times, the number corresponding to a number of times which the change of delay time is repeated, the plurality of sets of delay times being supplied, as the detecting results, to said correcting means, and wherein said correcting means calculates a difference among the delay times in each of the sets and corrects the delay time based on an average of the difference and the period of the clock signal.

10. The clock signal adjusting apparatus claimed in claim 6, wherein said clock adjusting means comprises:
third delay means for delaying an input signal by a delay time in accordance with the adjusting instruction and for outputting a delay signal as an internal clock signal;
fourth delay means for delaying the clock signal supplied from said clock generating means by a delay time which is variable and for supplying a delayed clock signal to said third delay means and said first delay means, wherein said feedback circuit forms loops including said first delay means and said fourth delay means, and wherein said adjusting control means comprises:
delay setting means for supplying to said first delay means a setting instruction corresponding to a predetermined delay time; and
delay adjusting means for, in each loop including said first delay means and said fourth delay means, adjusting the delay time in said fourth delay means based on the oscillating frequency obtained by said frequency measuring means.

11. The clock signal adjusting apparatus as claimed in claim 10, wherein said delay setting means supplies to the first delay means the setting instruction corresponding to the delay time which is a sum of the phase specified for a corresponding load unit and a predetermined standard delay time.

12. The clock signal adjusting apparatus as claimed in claim 4, wherein each of said plurality of first delay means comprises:
a delay circuit comprising a plurality of delay elements serially connected to each other, each of said plurality of delay elements making a predetermined delay; and
a selector for outputting one of outputs of said plurality of delay elements in accordance with the setting instruction.

13. The clock signal adjusting apparatus as claimed in claim 4, wherein said adjusting control means supplies, to a corresponding reference phase generating means, a start signal in which a logical state is changed in a predetermined timing in accordance with the phase adjusting instruction, and wherein said reference phase generating means comprises:
a flip flop circuit formed of a plurality of flip flops, the state of the start signal supplied to a first stage flip flop being transmitted to a last stage flip flop in said flip flop circuit in synchronism with the clock signal supplied from a corresponding first delay means;
stopping means for stopping an operation of the last stage flip flop in accordance with the changing state of the last stage flip flop; and
an output circuit for outputting an output of said flip flop circuit as the reference phase signal.

14. The clock signal adjusting apparatus as claimed in claim 13, wherein said output circuit provided in each of said reference phase generating means outputs a signal having an edge at which a level is changed in a direction corresponding to a direction in which a level of the clock signal to be processed by said coincidence determining means is changed at an edge.

15. The clock signal adjusting apparatus as claimed in claim 4, wherein each of said coincidence determining means comprises:

a flip flop for taking a logical state of the phase reference signal in synchronism with predetermined edges of the internal clock signal supplied thereto; and stopping means for supplying an instruction to said flip flop to stop an operation of said flip flop after a predetermined time elapses from a time at which the logical state of the phase reference signal is changed.

16. The clock signal adjusting apparatus as claimed in claim 15, wherein said adjusting control means comprises:

detecting means, when the output of said flip flop is changed from a first logical state which has been maintained for a time greater than a predetermined time corresponding to a phase difference, to a second logical state, and is then maintained at the first logical state for a time greater than the predetermined time, for detecting a delay time corresponding to the phase difference.

17. The clock signal adjusting apparatus as claimed in claim 4, wherein said adjusting control means comprises:

delay changing means for supplying the adjusting instruction to said clock adjusting means and for carrying out, at least once, a process for changing the delay time by said clock adjusting means within a predetermined range;

detecting means for detecting, based on the determination result obtained by said coincidence determining means and the adjusting instruction, a delay time by which the phases of the clock signal and the reference phase signal are coincident with each other; and adjusting instruction generating means for, every time said delay changing means carries out the process for changing the delay time, totalizing at least one delay time detected by said detecting means and for generating an adjusting instruction corresponding to an average of at least the delay time as the adjusting instruction to be used, the adjusting instruction being supplied to said clock adjusting means.

18. The clock signal adjusting apparatus as claimed in claim 4, wherein the corresponding load element provided in each of said plurality of load units includes said coincidence determining means, wherein said clock adjusting means has a delay circuit, corresponding to the load element in each of said load units, for delaying the clock signal by a delay time in accordance with the adjusting instruction and for outputting a delayed clock signal as the internal clock signal, wherein said adjusting control means generates the adjusting instruction to be supplied to said delay circuit in accordance with the determination result obtained by said coincidence determining means corresponding to the load element in each of said load units, and wherein each of said load units comprises:

an LSI element, in which the first delay means, said reference phase generating means and said clock adjusting means are integrated, having a clock terminal for the internal clock signal supplied to said load element and a reference signal terminal for the reference phase signal;

a reference phase distribution network through which the reference phase signal output from said reference signal terminal is transmitted to the load element; and a clock distribution network through which the internal clock signal output from the clock terminal is transmitted to the load element.

19. The clock signal adjusting apparatus as claimed in claim 18, wherein said LSI element corresponding to each of said plurality of load units has one or a plurality of buffer elements, corresponding to the reference signal terminal, for maintaining an output current required for output of the reference phase signal, outputs terminals of said one or plurality of buffer elements being short-circuited, and wherein said reference phase distribution network corresponding to said plurality of load units has wiring lines connecting the respective reference terminals to the load elements, the wiring lines having the same length.

20. The clock signal adjusting apparatus as claimed in claim 18, the reference phase distribution network corresponding to said plurality of load units has a wiring line connecting at least a reference signal terminal to a corresponding load element is short-circuited at least one point.

21. The clock signal adjusting apparatus as claimed in claim 18, wherein the LSI element corresponding to each of said plurality of load units has at least one buffer element for maintaining an output current required for output of the reference phase signal to at least one load element and for outputting the reference signal to said load element.

22. The clock signal adjusting apparatus as claimed in claim 18, wherein at least one load element provided in each of said plurality of load units has at least one internal distribution network for distributing the internal clock signal to a plurality of flip flops provided in said load element, wherein said coincidence determining means determines whether or not the phase of internal clock signal and the phase of the reference phase signal are coincident with each other, wherein said clock adjusting means has fifth delay means, corresponding to said internal distribution in said internal distribution network in the load element provided in the corresponding load unit, for delaying the clock signal by a delay time corresponding to the adjusting instruction supplied thereto, and wherein said adjusting control means generates the adjusting instruction to be supplied to the fifth delay means, based on the coincidence determination result, corresponding to the internal distribution network, obtained by said coincidence determining means provided in said load element.

23. The clock signal adjusting apparatus as claimed in claim 4, further comprising:

setting information storage means for storing setting information regarding a last state which is set in said clock adjusting means after said adjusting control means finishes the adjusting operation; and reading means for reading out the setting information from said setting information storage means in accordance with a setting instruction, the setting information read from said setting information storage means being supplied to said adjusting control means, wherein said adjusting control means generates the adjusting instruction corresponding to the setting information from said reading means in accordance with the setting instruction, the adjusting instruction being supplied to said clock adjusting means.

24. The clock signal adjusting apparatus as claimed in claim 23, further comprising:

sensing means for sensing environment in which said information processing unit is installed, wherein said setting information storage means receives environment information regarding the environment sensed by said sensing means and stores setting information items corresponding to different environment information items, and wherein said reading means reads out the setting information items corresponding to the environment information item obtained by said sensing means.

* * * * *

UNITED STATES PATENT AND TRADEMARK OFFICE
CERTIFICATE OF CORRECTION

PATENT NO.: 5,842,001
DATED : November 24, 1998
INVENTOR(S): Katsuhisa KUBOTA

It is certified that error appears in the above-identified patent and that said Letters Patent is hereby corrected as shown below:

Col. 3,      line 63, delete "ad";
                line 64, change "ting" to --adjusting--.

Col. 6,      line 21, change "125 means" to --means 125--.

Col. 9,      line 46, change "sid" to --said--.

Col. 15,    line 63, change "2414" to --$241_4$--.

Col. 20,    line 4, change "controls" to --control--.

Col. 24,    line 21, change "2471" to --$247_1$--;
                line 22, change "2471" to --$247_1$--.

Col. 26,    line 23, change "he" to --the--;
                line 31, change "vale" to --valve--.

Signed and Sealed this

Twenty-fifth Day of May, 1999

Attest:

Q. TODD DICKINSON

*Attesting Officer*        *Acting Commissioner of Patents and Trademarks*